(12) United States Patent
Kusada et al.

(10) Patent No.: US 8,530,140 B2
(45) Date of Patent: *Sep. 10, 2013

(54) OPTICAL INFORMATION RECORDING MEDIUM AND METHOD FOR MANUFACTURING THE SAME

(75) Inventors: Hideo Kusada, Osaka (JP); Rie Kojima, Osaka (JP); Takashi Nishihara, Osaka (JP); Noboru Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 418 days.

This patent is subject to a terminal disclaimer.

(21) Appl. No.: 12/593,979

(22) PCT Filed: Jan. 28, 2009

(86) PCT No.: PCT/JP2009/000315
§ 371 (c)(1), (2), (4) Date: Sep. 30, 2009

(87) PCT Pub. No.: WO2009/096174
PCT Pub. Date: Aug. 6, 2009

(65) Prior Publication Data
US 2010/0046346 A1 Feb. 25, 2010

(30) Foreign Application Priority Data

Jan. 31, 2008 (JP) ................. 2008-021761

(51) Int. Cl.
*G11B 7/24* (2013.01)
(52) U.S. Cl.
USPC .............. 430/270.13; 428/64.1; 369/100; 369/275.5; 369/275.3; 204/192.26
(58) Field of Classification Search
None
See application file for complete search history.

(56) References Cited

U.S. PATENT DOCUMENTS

| | | | |
|---|---|---|---|
| 5,146,299 A | * | 9/1992 | Lampe et al. ............ 257/295 |
| 6,479,121 B1 | * | 11/2002 | Miura et al. ............ 428/64.1 |
| 8,158,233 B2 | * | 4/2012 | Nishihara et al. ........... 428/64.1 |
| 8,323,763 B2 | * | 12/2012 | Tsuchino et al. ............ 428/64.1 |
| 2003/0038028 A1 | * | 2/2003 | Schultheis et al. ....... 204/298.13 |
| 2003/0180473 A1 | * | 9/2003 | Nishihara et al. ............ 427/457 |
| 2004/0105182 A1 | | 6/2004 | Nishihara et al. |
| 2004/0191683 A1 | * | 9/2004 | Nishihara et al. ........ 430/270.11 |

(Continued)

FOREIGN PATENT DOCUMENTS

| | | |
|---|---|---|
| JP | 2000-036130 | 2/2000 |
| JP | 2003-013201 A | 1/2003 |

(Continued)

*Primary Examiner* — Martin Angebranndt
(74) *Attorney, Agent, or Firm* — Hamre, Schumann, Mueller & Larson, P.C.

(57) ABSTRACT

An optical information recording medium of the present invention includes at least a recording layer (4) that allows information to be recorded thereon and/or reproduced therefrom by being irradiated with a laser beam, and a transmittance adjusting layer (7) in this order from an incident side of the laser beam (30). In the optical information recording medium of the present invention, the transmittance adjusting layer (7) contains Bi, Ti, and O and with a composition of Bi, Ti, and O contained in the transmittance adjusting layer (7) being denoted as $Bi_xTi_yO_z$, in atomic number ratio, x, y, and z satisfy $0.07 \leq x \leq 0.35$, $0.07 \leq y \leq 0.28$, $0.56 \leq z \leq 0.70$, and $x+y+z=1$. Or the transmittance adjusting layer (7) contains $Bi_2O_3$ and $TiO_2$, and with a composition of $Bi_2O_3$ and $TiO_2$ contained in the transmittance adjusting layer (7) being denoted as $(Bi_2O_3)_\alpha(TiO_2)_\beta$, in molar ratio, $\alpha$ and $\beta$ satisfy $0.2 \leq \alpha \leq 0.7$, $0.3 \leq \beta \leq 0.8$, and $\alpha+\beta=1$.

13 Claims, 1 Drawing Sheet

(56) References Cited

U.S. PATENT DOCUMENTS

| | | |
|---|---|---|
| 2005/0030882 A1 | 2/2005 | Kusada et al. |
| 2005/0074694 A1* | 4/2005 | Nishihara et al. ........ 430/270.13 |
| 2005/0202204 A1* | 9/2005 | Nishihara et al. ............ 428/64.4 |
| 2005/0244753 A1* | 11/2005 | Mishima et al. ......... 430/270.12 |
| 2006/0044991 A1* | 3/2006 | Nishihara et al. .......... 369/272.1 |
| 2006/0083150 A1* | 4/2006 | Sakaue et al. ................ 369/125 |
| 2006/0141202 A1* | 6/2006 | Suenaga ..................... 428/64.1 |
| 2006/0222810 A1* | 10/2006 | Hayashi et al. ............. 428/64.4 |
| 2007/0107774 A1* | 5/2007 | Jin et al. ....................... 136/258 |
| 2009/0022932 A1 | 1/2009 | Fujii et al. |
| 2009/0059758 A1* | 3/2009 | Nishihara et al. ............... 369/94 |
| 2009/0086608 A1 | 4/2009 | Takaoka et al. |
| 2009/0246558 A1* | 10/2009 | Nishihara et al. .......... 428/822.1 |
| 2010/0151179 A1* | 6/2010 | Nishihara et al. ............ 428/64.5 |
| 2011/0151277 A1* | 6/2011 | Nishihara et al. ............. 428/697 |
| 2011/0177280 A1* | 7/2011 | Tsuchino et al. ............. 428/64.4 |

FOREIGN PATENT DOCUMENTS

| | | | |
|---|---|---|---|
| JP | 2004-246942 | * | 9/2004 |
| JP | 2005-071577 A | | 3/2005 |
| JP | 2008-097794 A | | 4/2008 |
| WO | WO 03/025922 A1 | | 3/2003 |
| WO | 2006/112165 | * | 10/2006 |
| WO | WO 2007/119439 A1 | | 10/2007 |
| WO | WO 2008/032548 A1 | | 3/2008 |

* cited by examiner

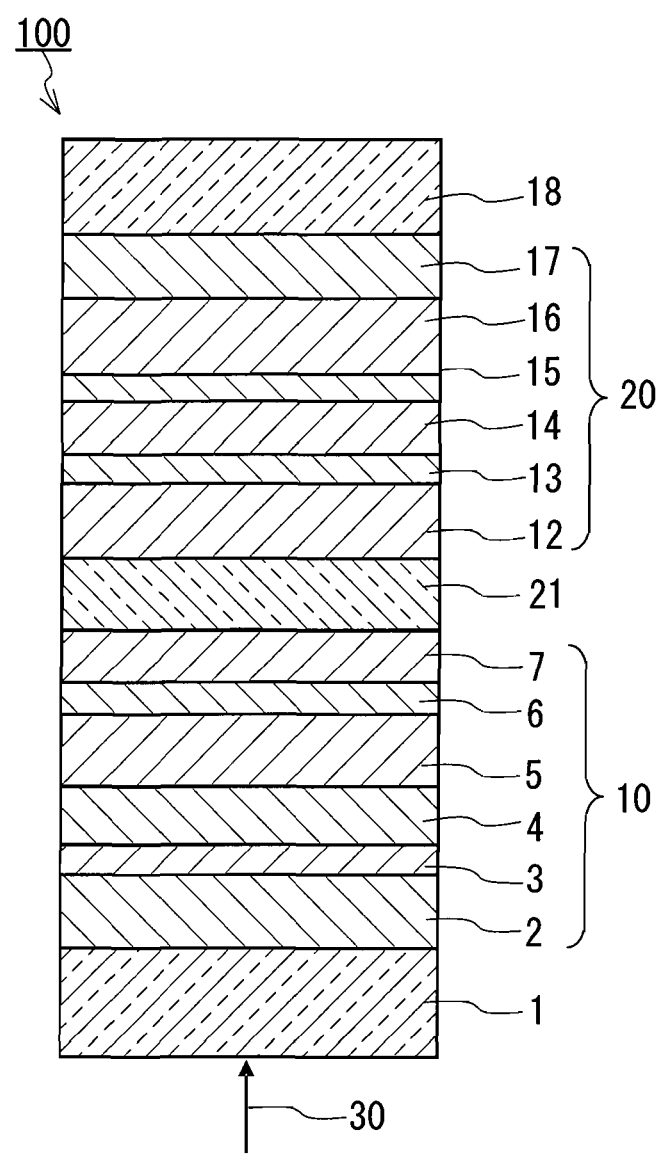

OPTICAL INFORMATION RECORDING MEDIUM AND METHOD FOR MANUFACTURING THE SAME

TECHNICAL FIELD

The present invention relates to an optical information recording medium that allows information to be recorded thereon and/or reproduced therefrom by being irradiated with a laser beam, and a method for manufacturing the optical information recording medium.

BACKGROUND ART

Information recording media are widely researched, developed and commercialized. The information recording media allow information to be recorded thereon and erased therefrom when a thin film thereof formed of, for example, a chalcogen material, is irradiated with a laser beam and thereby is heated locally so that the difference in irradiation conditions causes a phase change between states with different optical constants.

Among the information recording media that utilize the phase change, an optical recording medium allows signals to be recorded through the modulation of output power of a laser beam between at least two power levels. Suitable selection of the power level makes it possible to record a new signal simultaneously while erasing a signal that has been recorded.

Research and development have been conducted actively for optical information recording media that allow information to be recorded thereon, and reproduced and erased therefrom, which are formed by stacking a plurality of component layers (hereinafter referred to as information layers) including a phase-change recording film whose phase changes by a laser beam that is incident from one side. For example, in a commercialized optical information recording medium having two information layers that allow information to be recorded thereon and reproduced therefrom, recording and reproducing with respect to one of the information layers (hereinafter referred to as a second information layer) disposed farther from the laser beam incident side are performed with a laser beam that has been transmitted through the other information layer (hereinafter referred to as a first information layer) disposed closer to the laser beam incident side. Accordingly, it is preferable that the first information layer has as high a transmittance as possible.

As one method for achieving the high transmittance, it is proposed to use, for a material layer (transmittance adjusting layer) constituting the first information layer, a material that is transparent and has a high refractive index with respect to the wavelength of the laser beam to be used. For example, it is proposed to use $TiO_2$ for the transmittance adjusting layer in a recently-disclosed dual-layer rewritable optical recording medium using a blue laser (see WO 03/025922).

Also, as the material for a protective layer that directly covers a recording layer, a material has been disclosed that contains $TiO_2$ as a main component, and 2.5 wt % to 11 wt % of $Nb_2O_5$, which is almost equal to 4 mol % or less of $Nb_2O_5$, or 3 atom % or less of Nb atoms, both added thereinto (see JP 2003-013201 A).

However, $TiO_2$, which has been used conventionally as a material for the transmittance adjusting layer, has problems in that it takes a longer time to manufacture an information recording medium since it has a low deposition rate during sputtering and a great variation in deposition rate due to moisture, and it is difficult to maintain a constant thickness of the $TiO_2$ film.

With the material that contains $TiO_2$ as a main component and $Nb_2O_5$ added thereinto, it is difficult to increase the refractive index sufficiently. When the material is used for the transmittance adjusting layer of the first information layer, it is difficult to increase the transmittance of the first information layer

DISCLOSURE OF THE INVENTION

The present invention solves the aforementioned problems and is intended to provide an optical information recording medium including an excellent transmittance adjusting layer with both a high refractive index and a stable, high deposition rate, and having excellent recording/reproducing characteristics and corrosion resistance.

A first optical information recording medium of the present invention includes at least a recording layer that allows information to be recorded thereon and/or reproduced therefrom by being irradiated with a laser beam, and a transmittance adjusting layer in this order from a laser beam incident side. The transmittance adjusting layer contains Bi, Ti, and O, and with a composition of Bi, Ti, and O contained in the transmittance adjusting layer being denoted as $Bi_xTi_yO_z$, in atomic number ratio, x, y, and z satisfy $0.07 \leq x \leq 0.35$, $0.07 \leq y \leq 0.28$, $0.56 \leq z \leq 0.70$, and $x+y+z=1$.

The first optical information recording medium of the present invention also is applicable to a multilayer optical information recording medium including a plurality of information layers. In this case, the first optical information recording medium of the present invention includes N information layers, where N is an integer satisfying $N \geq 2$. With the N information layers being referred to as a first information layer to an N-th information layer sequentially from the laser beam incident side, an L-th information layer included in the N information layers includes the recording layer and the transmittance adjusting layer in this order from the laser beam incident side, where L is at least an integer satisfying $1 \leq L \leq N-1$ A second optical information recording medium of the present invention includes at least a recording layer that allows information to be recorded thereon and/or reproduced therefrom by being irradiated with a laser beam, and a transmittance adjusting layer in this order from a laser beam incident side. The transmittance adjusting layer contains $Bi_2O_3$ and $TiO_2$, and with a composition of $Bi_2O_3$ and $TiO_2$ contained in the transmittance adjusting layer being denoted as $(Bi_2O_3)_\alpha(TiO_2)_\beta$, in molar ratio, $\alpha$ and $\beta$ satisfy $0.2 \leq \alpha \leq 0.7$, $0.3 \leq \beta \leq 0.8$, and $\alpha+\beta=1$.

The second optical information recording medium of the present invention also is applicable to a multilayer optical information recording medium including a plurality of information layers. In this case, the second optical information recording medium of the present invention includes N information layers, where N is an integer satisfying $N \geq 2$. With the N information layers being referred to as a first information layer to an N-th information layer sequentially from the laser beam incident side, an L-th information layer included in the N information layers includes the recording layer and the transmittance adjusting layer in this order from the laser beam incident side, where L is at least an integer satisfying $1 \leq L \leq N-1$.

The method for manufacturing the optical information recording medium of the present invention is a method for manufacturing the first optical information recording medium or the second optical information recording medium of the present invention. The method for manufacturing the optical information recording medium of the present invention includes the step of forming the transmittance adjusting layer. The step of forming the transmittance adjusting layer is performed by sputtering and uses a sputtering target containing Bi, Ti, and O.

According to the optical information recording medium of the present invention and the method for manufacturing the optical information recording medium, it is possible to form the transmittance adjusting layer at a stably high deposition rate, and to increase the transmittance of the information layer including the transmittance adjusting layer. Thereby, the optical information recording medium having excellent recording/reproducing characteristics, corrosion resistance, and suitable for mass production can be provided.

BRIEF DESCRIPTION OF THE DRAWING

FIG. 1 is a partial cross-sectional view of the optical information recording medium in an embodiment of the present invention.

BEST MODE FOR CARRYING OUT THE INVENTION

A first optical information recording medium of the present invention includes at least a recording layer that allows information to be recorded thereon and/or reproduced therefrom by being irradiated with a laser beam, and a transmittance adjusting layer in this order from a laser beam incident side. The transmittance adjusting layer contains Bi, Ti, and O, and with a composition of Bi, Ti, and O contained in the transmittance adjusting layer being denoted as $Bi_xTi_yO_z$, in atomic number ratio, x, y, and z satisfy $0.07 \leq x \leq 0.35$, $0.07 \leq y \leq 0.28$, $0.56 \leq z \leq 0.70$, and $x+y+z=1$. Moreover, the first optical information recording medium of the present invention may be a multilayer optical information recording medium. In this case, the first optical information recording medium of the present invention is an optical information recording medium including N information layers, where N is an integer satisfying $N \geq 2$. With the N information layers being referred to as a first information layer to an N-th information layer sequentially from the laser beam incident side, an L-th information layer included in the N information layers includes the recording layer that allows information to be recorded thereon and/or reproduced therefrom by being irradiated with a laser beam, and the transmittance adjusting layer in this order from the laser beam incident side, where L is at least an integer satisfying $1 \leq L \leq N-1$. The transmittance adjusting layer contains Bi, Ti, and O, and with a composition of Bi, Ti, and O contained in the transmittance adjusting layer being denoted as $Bi_xTi_yO_z$, in atomic number ratio, x, y, and z satisfy $0.07 \leq x \leq 0.35$, $0.07 \leq y \leq 0.28$, $0.56 \leq z \leq 0.70$, and $x+y+z=1$. Furthermore, in the first optical information recording medium of the present invention, it is preferable that x, y, and z satisfy $0.16 \leq x \leq 0.29$, $0.09 \leq y \leq 0.20$, $0.61 \leq z \leq 0.65$, and $x+y+z=1$, and it is more preferable that x, y, and z satisfy $0.165 \leq x \leq 0.255$, $0.120 \leq y \leq 0.195$, $0.625 \leq z \leq 0.640$, and $x+y+z=1$.

In the first optical information recording medium of the present invention, the transmittance adjusting layer further may contain M, where M is at least one element selected from C, Si, Zr, Hf, Y, Cr, Zn, Ga, Co, In, Ta, Ag, Cu, Pd, Ge, Sb, Te, and Ce). In this case, with a composition of Bi, Ti, O, and M contained in the transmittance adjusting layer being denoted as $Bi_aTi_bO_cM_d$, in atomic number ratio, a, b, c, and d satisfy preferably $0.07 \leq a \leq 0.35$, $0.07 \leq b \leq 0.28$, $0.61 \leq c \leq 0.65$, $0 \leq d \leq 0.05$, and $a+b+c+d=1$. More preferably, a, b, c, and d satisfy $0.16 \leq a \leq 0.29$, $0.09 \leq b \leq 0.20$, $0.61 \leq c \leq 0.64$, $0 \leq d \leq 0.05$, and $a+b+c+d=1$.

A second optical information recording medium of the present invention includes at least a recording layer that allows information to be recorded thereon and/or reproduced therefrom by being irradiated with a laser beam, and a transmittance adjusting layer in this order from the laser beam incident side. The transmittance adjusting layer contains $Bi_2O_3$ and $TiO_2$, and with a composition of $Bi_2O_3$ and $TiO_2$ contained in the transmittance adjusting layer being denoted as $(Bi_2O_3)_\alpha(TiO_2)_\beta$, in molar ratio, $\alpha$ and $\beta$ satisfy $0.2 \leq \alpha \leq 0.7$, $0.3 \leq \beta \leq 0.8$, and $\alpha+\beta=1$. Moreover, the second optical information recording medium of the present invention may be a multilayer optical information recording medium. In this case, the second optical information recording medium of the present invention is an optical information recording medium including N information layers, where N is an integer satisfying $N \geq 2$. With the N information layers being referred to as a first information layer to an N-th information layer sequentially from the laser beam incident side, an L-th information layer included in the N information layers includes the recording layer that allows information to be recorded thereon and/or reproduced therefrom by being irradiated with a laser beam, and the transmittance adjusting layer in this order from the laser beam incident side, where L is at least an integer satisfying $1 \leq L \leq N-1$. The transmittance adjusting layer contains $Bi_2O_3$ and $TiO_2$, and with a composition of $Bi_2O_3$ and $TiO_2$ contained in the transmittance adjusting layer being denoted as $(Bi_2O_3)_\alpha(TiO_2)_\beta$, in molar ratio, $\alpha$ and $\beta$ satisfy $0.2 \leq \alpha \leq 0.7$, $0.3 \leq \beta \leq 0.8$, and $\alpha+\beta=1$. Furthermore, in the second optical information recording medium of the present invention, it is preferable that $\alpha$ and $\beta$ satisfy $0.3 \leq \alpha \leq 0.65$, $0.35 \leq \beta \leq 0.7$, and $\alpha+\beta=1$, and it is more preferable that $\alpha$ and $\beta$ satisfy $0.30 \leq \alpha \leq 0.50$, $0.50 \leq \beta \leq 0.70$, and $\alpha+\beta=1$.

The transmittance adjusting layer in the optical information recording medium of the present invention may contain a small amount of a component other than the aforementioned components as long as the transmittance adjusting layer to be obtained has the characteristics that the present invention is intended to provide. In reality, however, a material substantially composed of the aforementioned components is used preferably. A phrase "the transmittance adjusting layer substantially is formed of the aforementioned components" is meant to include not only the case where the transmittance adjusting layer is formed of a material composed only of the aforementioned components (a material composed of Bi, Ti, and O, or a material composed of Bi, Ti, O, and M), but also the case where the transmittance adjusting layer is formed of a material that contains the material composed only of the aforementioned components and another component mixed therein unavoidably.

In each of the first optical information recording medium and the second optical information recording medium of the present invention, the transmittance adjusting layer preferably has a thickness of at least 3 nm but not more than 40 nm, or at least 60 nm but not more than 130 nm. Thereby, the transmittance of the information layer including the transmittance adjusting layer can be enhanced.

Next, the method for manufacturing the optical information recording medium of the present invention is a method for manufacturing the first optical information recording medium or the second optical information recording medium of the present invention, and it includes the step of forming the transmittance adjusting layer. The step of forming the transmittance adjusting layer is performed by sputtering and uses a sputtering target containing Bi, Ti and O. In this case, with a composition of Bi, Ti, and O contained in the sputtering target being denoted as $Bi_pTi_qO_r$, in atomic number ratio, p, q, and r satisfy $0.07 \leq p \leq 0.35$, $0.07 \leq q \leq 0.28$, $0.56 \leq r \leq 0.70$, and $p+q+r=1$.

In the method for manufacturing the optical information recording medium of the present invention, the transmittance adjusting layer preferably is formed by direct-current pulse discharge in the step of forming the transmittance adjusting layer.

Next, embodiments of the present invention will be described with reference to the drawing. The following embodiments are examples of the present invention and the present invention is not limited to these. Furthermore, in the following embodiments, the same parts will be indicated with identical numerals and the same descriptions thereof may be omitted.

FIG. 1 shows a partial cross-sectional view of an optical information recording medium 100 of the present embodiment. On the optical information recording medium 100, recording and reproducing are performed by irradiation of a laser beam 30. The optical information recording medium 100 of the present embodiment is of the case where N=2 in the optical information recording medium of the present invention. Specifically, in the present embodiment, the optical information recording medium 100 includes two information layers, and a first information layer 10 corresponds to the L-th information layer in the present invention.

The optical information recording medium 100 includes an optical separation layer 21 (also serving as a second substrate. Hereinafter, it is only referred to as an optical separation layer), and the first information layer 10 and a second information layer 20 disposed so as to sandwich the optical separation layer 21 therebetween. The first information layer 10 is disposed closer to an laser beam 30 incident side than the second information layer 20.

The first information layer 10 includes a cover layer 1, a first lower protective layer 2, a first lower interface layer 3, a first recording layer 4, a first upper protective layer 5, a first reflective layer 6, and a transmittance adjusting layer 7 disposed sequentially from the laser beam 30 incident side. If needed, a first upper interface layer may be provided between the first recording layer 4 and the first upper protective layer 5, although it is not illustrated.

The second information layer 20 includes a second lower protective layer 12, a second lower interface layer 13, a second recording layer 14, a second upper interface layer 15, a second upper protective layer 16, a second reflective layer 17, and a first substrate 18 disposed sequentially from the laser beam 30 incident side. In the names of the interface layers and the protective layers in this specification, "lower" means that the layer is disposed on the laser beam 30 incident side with respect to the recording layer, and "upper" means that the layer is disposed on a side opposite to the laser beam 30 incident side with respect to the recording layer. Furthermore, when a plurality of layers having similar functions are provided in the optical information recording medium 100 of the present embodiment, they are differentiated from each other by being referred to as a first, a second, sequentially from the laser beam 30 incident side for easier explanation.

The laser beam 30 is incident from a cover layer 1 side. With respect to the second information layer 20, recording and reproducing are performed with the laser beam 30 transmitted through the first information layer 10 and the optical separation layer 21.

The first substrate 18 can be formed using, for example, a resin, such as polycarbonate, amorphous polyolefin, and PMMA (polymethylmethacrylate), or glass.

Guide grooves for guiding the laser beam 30 may be formed on an inner surface (on an optical separation layer 21 side) of the first substrate 18, if needed. An outer surface of the first substrate 18 preferably is smooth. Preferably, the first substrate 18 has low optical birefringence in a short wavelength region. As the material for the first substrate 18, polycarbonate particularly is preferable because it has excellent transferability and mass productivity, and is inexpensive. The cover layer 1 has a thickness in a range of, for example, 10 μm to 800 μm (preferably 50 μm to 150 μm, or 550 μm to 650 μm). The first substrate 18 has a thickness in a range of, for example, 400 μm to 1300 μm (preferably 550 μm to 650 μm, or 1050 μm to 1150 μm).

The first lower protective layer 2, the first upper protective layer 5, the second lower protective layer 12, and the second upper protective layer 16 each are formed of a dielectric material. These protective layers have a function of adjusting the optical distance to increase the optical absorption efficiencies of the recording layers and a function of increasing the change in amount of reflected light between before and after recording to increase the signal amplitude. Examples of the material that can be used for these protective layers include oxides such as $SiO_x$ (x is 0.5 to 2.5), $Al_2O_3$, $TiO_2$, $Ta_2O_5$, $ZrO_2$, $ZnO$, $Cr_2O_3$, $Ta_2O_5$, $Bi_2O_3$, $Bi_4T_3O_{12}$, $CeO_2$, $Cu_2O$, $In_2O_3$, $MgO$, $MgSiO_3$, $Nb_2O_5$, $SnO_2$, $WO_3$, $Y_2O_3$, $ZrSiO_4$, and Te—O. Nitrides such as Si—N, Al—N, Ti—N, Ta—N, Zr—N, and Ge—N also can be used. Furthermore, sulfides such as ZnS and carbides such as SiC also can be used. In addition, a mixture of the above-mentioned materials also can be used.

The thicknesses of the first lower protective layer 2 and the first upper protective layer 5 can be determined precisely so that the change in amount of reflected light is large between the case where the first recording layer 4 is in a crystalline phase and the case where it is in an amorphous phase, the first information layer 10 has a high transmittance, and the first recording layer 4 has a high optical absorption efficiency. Specifically, these thicknesses can be determined using, for example, a calculation based on a matrix method.

For example, when a laser beam with a wavelength of 405 nm is used as the laser beam 30, the thickness of the first lower protective layer 2 preferably is at least 20 nm but not more than 60 nm, in the case where a material (such as ZnS-20 mol % $SiO_2$ (a mixture of 80 mol % of ZnS and 20 mol % of $SiO_2$. Hereinafter, the same notification system may be used in the same manner) with a refractive index of 2.2 and an extinction coefficient of 0.0, for example, is used for the first lower protective layer 2. The thickness of the first upper protective layer 5 preferably is at least 3 nm but not more than 30 nm in the case where a material (such as $(ZrO_2)_{25}(SiO_2)_{25}(Cr_2O_3)_{50}$ (mol %) (a mixture of 25 mol % of $ZrO_2$, 25 mol % of $SiO_2$, and 50 mol % of $Cr_2O_3$. Hereinafter, the same notification system may be used in the same manner) with a refractive index of 2.3 and an extinction coefficient of 0.0, for example, is used for the first upper protective layer 5.

Similarly, the thicknesses of the second lower protective layer 12 and the second upper protective layer 16 also can be determined precisely so that the change in amount of reflected light is large between the case where the second recording layer 14 is in a crystalline phase and the case where it is in an amorphous phase, and the second recording layer 14 has a high optical absorption efficiency.

For example, when a laser beam with a wavelength of 405 nm is used as the laser beam 30, the thickness of the second lower protective layer 12 preferably is at least 20 nm but not more than 60 nm in the case where a material (such as ZnS-20 mol % $SiO_2$) with a refractive index of 2.2 and an extinction coefficient of 0.0 is used, for example, for the second lower protective layer 12. The thickness of the second upper protective layer 16 preferably is at least 1 nm but not more than 10 nm in the case where a material (such as $(ZrO_2)_{25}$ $(SiO_2)_{25}(Cr_2O_3)_{50}$ (mol %)) with a refractive index of 2.3 and an extinction coefficient of 0.0 is used, for example, for the second upper protective layer 16.

The first lower protective layer 2, the first upper protective layer 5, the second lower protective layer 12, and the second upper protective layer 16 may be formed of a different material and a different composition from each other, or may be formed of the same material and the same composition as each other. These protective layers can be formed by sputtering, for example.

For the first lower protective layer 2 and the second lower protective layer 12, a material preferably is used that can be formed into a film as thick as tens of nanometers at high speed, and has excellent mass productivity and a high refractive index. For example, a material obtained by mixing ZnS and $SiO_2$ is used preferably.

For the first upper protective layer 5 and the second upper protective layer 16, an oxide material preferably is used in order to prevent mass transfer from occurring due to repetitive recording. Preferably, a material obtained by mixing $ZrO_2$, $SiO_2$, and $Cr_2O_3$ is used, for example.

The first lower interface layer 3, the second lower interface layer 13, and the second upper interface layer 15 each have a function of preventing mass transfer from occurring between the first lower protective layer 2 and the first recording layer 4, between the second lower protective layer 12 and the second recording layer 14, and between the second upper protective layer 16 and the second recording layer 14, respectively. These interface layers prevent particularly the mass transfer from occurring due to repetitive recording. Examples of the material that can be used for the interface layers include oxides such as $SiO_x$ (x is 0.5 to 2.5), $Al_2O_3$, $TiO_2$, $Ta_2O_5$, $ZrO_2$, ZnO, $Cr_2O_3$, $Ta_2O_3$, $Bi_2O_3$, $Bi_4T_3O_{12}$, $CeO_2$, $Cu_2O$, $In_2O_3$, MgO, $MgSiO_3$, $Nb_2O_5$, $SnO_2$, $WO_3$, $Y_2O_3$, $ZrSiO_4$, and Te—O. Nitrides such as Si—N, Al—N, Ti—N, Ta—N, Zr—N, and Ge—N, and oxynitrides containing these nitrides also can be used. Carbides such as SiC also can be used. Furthermore, a mixture of these materials also can be used. When an interface layer is provided as the first upper interface layer between the first upper protective layer 5 and the first recording layer 4, the first upper interface layer also can be formed in the same manner as in the cases of the interface layers 3, 13, and 15.

The interface layer with a large thickness changes significantly the reflectance and the absorption coefficient of the information layer, affecting the recording and erasing performance thereof. Thus, the thickness of the interface layer preferably is in a range of 1 nm to 10 nm, and more preferably in a range of 2 nm to 5 nm.

The first lower interface layer 3, the second lower interface layer 13, and the second upper interface layer 15 may be formed of a different material and a different composition from each other, or may be formed of the same material and the same composition as each other. These interface layers can be formed by sputtering, for example.

The first recording layer 4 and the second recording layer 14 are recording layers that allow information to be recorded thereon and/or reproduced therefrom by being irradiated with the laser beam 30, and are formed of a material whose phase changes reversibly between a crystalline phase and an amorphous phase under the irradiation of the laser beam 30. The first recording layer 4 can be formed of, for example, a material containing Ge, Sb, and Te. Here, the second recording layer 14 preferably is formed of a different material from that of the first recording layer 4. The second recording layer 14 preferably is formed of a material having a lower melting point than that of the material of the first recording layer 4.

Preferably, the thickness of the first recording layer 4 is 9 nm or less, and more preferably, in a range of 5 nm to 7 nm, in order to increase the transmittance of the first information layer 10 so that a necessary amount of laser beam for recording and reproducing information on and from the second information layer 20 reach the second information layer 20.

Preferably, the thickness of the second recording layer 14 is in a range of 6 nm to 15 nm in order to increase the recording sensitivity of the second information layer 20. Preferably, the thickness of the second recording layer 14 is in a range of 8 nm to 12 nm, taking into account the thermal effect on an adjacent region (a region adjacent to the region on which recording is performed under laser beam irradiation) caused by the in-plane heat diffusion that occurs when the second recording layer 14 is thick, and the decrease in reflectance of the second information layer 20 that occurs when the second recording layer 14 is thin.

The first recording layer 4 and the second recording layer 14 may be formed of a different material and a different composition from each other, or may be formed of the same material and the same composition as each other. These recording layers can be formed by sputtering, for example.

The first reflective layer 6 and the second reflective layer 17 each have an optical function of increasing the amount of light to be absorbed by the first recording layer 4 and the second recording layer 14, respectively. These reflective layers also have a thermal function of diffusing quickly the heat generated in the recording layers (the first recording layer 4 and the second recording layer 14) so as to facilitate the amorphization of the recording layers. Furthermore, these reflective layers also have a function of protecting a multilayer film constituting the optical information recording medium 100 from the environment in which it is used.

As the material for the first reflective layer 6 and the second reflective layer 17, a single metal with a high thermal conductivity, such as Al, Au, Ag, and Cu, can be used. Or it is possible to use an alloy containing, as a main component, one or more elements selected from these metal elements and one or more other elements that are added thereto in order to, for example, enhance the moisture resistance and adjust the thermal conductivity. Specifically, an alloy such as Al—Cr, Al—Ti, Au—Pd, Au—Cr, Ag—Pd, Ag—Pd—Cu, Ag—Pd—Ti, Ag—Ru—Au, and Cu—Si can be used. These alloys are all excellent materials having excellent corrosion resistance and satisfying rapid cooling requirements. Particularly, an Ag alloy is preferable as the material for the first reflective layer 6 because it has a high thermal conductivity and also a high light transmittance.

Preferably, the first reflective layer 6 has refractive index n2 and extinction coefficient k2 that satisfy $n2 \leq 2.0$ and $1.0 \leq k2$, respectively in order to increase further the transmittance of the first information layer 10. More preferably, they satisfy $0.1 \leq n2 \leq 1.0$ and $1.5 \leq k2 \leq 4.0$, respectively.

In order to increase the transmittance Tc (%) and transmittance Ta (%) of the first information layer 10 as much as possible, the thickness of the first reflective layer 6 preferably is in a range of 5 nm to 15 nm, and more preferably in a range of 8 nm to 12 nm. When the thickness of the first reflective layer 6 is less than 5 nm, the thermal diffusion function thereof may be insufficient and the reflectance of the first information layer 10 may be lowered. When the thickness of the first reflective layer 6 is more than 15 nm, the transmittance of the first information layer 10 may be insufficient. In this specification, the transmittance Tc (%) represents the transmittance of the first information layer 10 when the first recording layer 4 is in a crystalline phase, and the transmittance Ta (%) represents the transmittance of the first information layer 10 when the first recording layer 4 is in an amorphous phase.

On the other hand, the second information layer 20 does not need to have a high transmittance. Thus, the thickness of the second reflective layer 17 preferably is in a range of 30 nm to 150 nm, and more preferably in a range of 70 nm to 90 nm. When the thickness of the second reflective layer 17 is less than 30 nm, the thermal diffusion function thereof may be insufficient, and it may be difficult for the second recording layer 14 to be amorphous. When the thickness of the second reflective layer 17 is more than 150 nm, the thermal diffusion function thereof is too strong and the recording sensitivity of the second information layer 20 may be lowered.

The first reflective layer 6 and the second reflective layer 17 may be formed of a different material and a different composition from each other, or may be formed of the same material and the same composition as each other. These reflective layers can be formed by sputtering, for example.

In the optical information recording medium of the present embodiment, the transmittance adjusting layer 7 has a function of adjusting the transmittance of the first information layer 10. The transmittance adjusting layer 7 makes it possible to increase both of the transmittance Tc (%) of the first information layer 10 when the first recording layer 4 is in a crystalline phase and the transmittance Ta (%) of the first information layer 10 when the recording layer is in an amorphous phase.

Specifically, the first information layer 10 including the transmittance adjusting layer 7 has a transmittance 2% to 10% higher than that of the first information layer without the transmittance adjusting layer. Moreover, the transmittance adjusting layer 7 has also an effect of diffusing effectively the heat generated in the first recording layer 4.

Refractive index n1 and extinction coefficient k1 of the transmittance adjusting layer 7 satisfy preferably $2.0 \leq n1 \leq 3.0$ and $k1 \leq 0.1$, and more preferably $2.5 \leq n1 \leq 3.0$ and $k1 \leq 0.08$, in order to enhance further the effect of increasing the transmittances Tc and Ta of the first information layer 10. Preferably, thickness d1 of the transmittance adjusting layer 7 is in a range of $(1/32)\lambda/n1 \leq d1 \leq (3/16)\lambda/n1$ or $(17/32)\lambda/n1 \leq d1 \leq (11/16)\lambda/n1$, and more preferably in a range of $(1/16)\lambda/n1 \leq d1 \leq (5/32)\lambda/n1$ or $(9/16)\lambda/n1 \leq d1 \leq (21/32)\lambda/n1$. When the wavelength $\lambda$ of the laser beam 30 and the refractive index n1 of the transmittance adjusting layer 7 are selected, for example, from a range of 350 nm $\leq \lambda \leq$ 450 nm and $2.0 \leq n1 \leq 3.0$, respectively, the thickness d1 preferably is in a range of 3 nm $\leq$ d1 $\leq$ 40 nm or 60 nm $\leq$ d1 $\leq$ 130 nm, and more preferably in a range of 7 nm $\leq$ d1 $\leq$ 30 nm or 65 nm $\leq$ d1 $\leq$ 120 nm. Selecting the d1 from these ranges makes it possible to increase both of the transmittances Tc and Ta of the first information layer 10.

Preferably, the material to be used for the transmittance adjusting layer 7 is a material that is stable and has a high refractive index, a low extinction coefficient, and a high deposition rate, and the material containing Bi, Ti, and O is used in the present embodiment. As the material containing Bi, Ti, and O, a mixture of $Bi_2O_3$ and $TiO_2$ can be mentioned, for example. By adjusting suitably the mixing ratio between $Bi_2O_3$ and $TiO_2$, it is possible to increase the refractive index n1 to fall in a range of 2.7 to 2.8 and decrease the extinction coefficient k1 to fall in a range of 0.0 to 0.10. Thereby, the effect of increasing the transmittance of the first information layer 10 is enhanced. The transmittance adjusting layer 7 may contain an element other than Bi, Ti, and O. However, when the sum total of the atoms contained in the transmittance adjusting layer 7 is taken as 100 atom %, the sum total of Bi, Ti, and O atoms is at least 90 atom %, preferably at least 95 atom %. The transmittance adjusting layer 7 may be composed only of Bi, Ti, and O. When the transmittance adjusting layer 7 contains another element (M), the element M is at least one element selected from C, Si, Zr, Hf, Y, Cr, Zn, Ga, Co, In, Ta, Ag, Cu, Pd, Ge, Sb, Te, and Ce, for example.

Use of the material containing Bi, Ti and O can enhance the mass productivity of the optical information recording medium. More specifically, a sputtering target made of the material containing Bi, Ti and O exhibits a higher deposition rate (may be referred to as a sputtering rate hereinafter) in spattering than that of, for example, a $TiO_2$ sputtering target for forming a $TiO_2$ thin film with a high refractive index and a low extinction coefficient. Moreover, the sputtering rate of the sputtering target made of the material containing Bi, Ti and O is less likely to vary due to an impurity gas than that of the $TiO_2$ sputtering target. Thereby, high speed and stable sputtering can be realized. As the impurity gas, water etc. out of the polycarbonate substrate can be mentioned, for example.

With the composition of Bi, Ti, and O contained in the transmittance adjusting layer 7 being denoted as $Bi_xTi_yO_z$, in atomic number ratio, x, y, and z satisfy $0.07 \leq x \leq 0.35$, $0.07 \leq y \leq 0.28$, $0.56 \leq z \leq 0.70$, and $x+y+z=1$. Preferably, x, y, and z satisfy $0.16 \leq x \leq 0.29$, $0.09 \leq y \leq 0.20$, $0.56 \leq z \leq 0.70$, and $x+y+z=1$. More preferably, x, y, and z satisfy $0.165 \leq x \leq 0.255$, $0.120 \leq y \leq 0.195$, $0.625 \leq z \leq 0.640$, and $x+y+z=1$.

When the composition of Bi, Ti, and O contained in the transmittance adjusting layer 7 is denoted as $Bi_xTi_yO_z$ as mentioned above, setting x to 0.07 or more (the amount of Bi is 7 atom % or more) and/or setting y to 0.28 or less (the amount of Ti is 28 atom % or less) makes it possible to increase more the sputtering rate of the sputtering target used for forming the transmittance adjusting layer 7 than in the case where a $TiO_2$ material is used for the sputtering target. Moreover, it is possible to keep the sputtering rate relatively stable even when the impurity gas is present during sputtering.

Setting x to 0.35 or less (the amount of Bi is 35 atom % or less) and/or setting y to 0.07 or more (the amount of Ti is 7 atom % or more) makes it possible for the thin film to have an extinction coefficient of 1.0 or less because the ratio of $Bi_2O_3$ contained in the film is reduced. Thus, the transmittance of the first information layer 10 can be increased. The reduced ratio of $Bi_2O_3$ in the film makes it possible to ensure sufficiently the corrosion resistance of the recording medium.

Preferably, oxygen is contained in the thin film as a main component. Preferably, oxygen is contained in the form of $Bi_2O_3$ and $TiO_2$ that are chemically stable bonding states of Bi and Ti, respectively. When the composition of Bi, Ti, and O is denoted as $Bi_xTi_yO_z$, where x satisfies $0.07 \leq x \leq 0.35$ (7 atom % $\leq$ Bi $\leq$ 35 atom %) and y satisfies $0.07 \leq y \leq 0.28$ (7 atom % $\leq$ Ti $\leq$ 28 atom %), it is preferable to set the amount of oxygen to 56 atom % or more (z to 0.56 or more), from the viewpoint of having an extinction coefficient of 0.1 or less. More preferably, the amount of oxygen is set to 61 atom % or more (z to 0.61 or more).

The transmittance adjusting layer 7 is formed by sputtering, using usually an argon gas or a mixed gas of argon gas and oxygen gas. When the sputtering is performed in an atmosphere of gas containing an excess amount of oxygen, the sputtering rate becomes lower than when the sputtering is performed with a proper oxygen concentration. Also, an excess amount of oxygen, which is more than the oxygen contained in $Bi_2O_3$ and $TiO_2$, is contained in the thin film. From the viewpoint of increasing the sputtering rate further, the upper limit for the amount of oxygen contained in the thin film preferably is 70% or less (z is 0.70 or less), and more preferably 65% or less (z is 0.65 or less).

The transmittance adjusting layer 7 can be formed by sputtering a sputtering target material obtained by, for example, mixing appropriately $Bi_2O_3$ powder and $TiO_2$ powder and sintering it. However, since such a sputtering target has a high resistance, a high frequency (RF) electrode is used as a discharge electrode.

On the other hand, a sputtering target material has a low resistance when obtained by, for example, mixing appropriately $Bi_2O_3$ powder, $TiO_2$ powder, and powder of $TiO_x$ (x is 1.6 to 1.8, for example) that is oxygen-deficient $TiO_2$, and sintering the mixture. In this case, a direct-current (DC) pulse electrode can be used. Use of such a sputtering target makes it possible to form the transmittance adjusting layer 7 containing, as main components, stable oxides denoted as $Bi_2O_3$ and $TiO_2$, when using, as the gas for the sputtering, a gas obtained by, for example, mixing a proper amount of oxygen into an argon gas, and performing the DC pulse discharge.

In the case of forming thin films having the same composition, DC pulse discharge can increase the sputtering rate more than RF discharge. Thus, it is more preferable to form the thin film by DC pulse discharge. Accordingly, it is preferable to use DC pulse discharge when forming the transmittance adjusting layer 7.

Preferably, the amount of oxygen gas to be introduced during DC pulse discharge is adjusted appropriately according to the sputtering target composition. Introducing an oxygen gas during DC pulse discharge makes it possible to lower the extinction coefficient of the thin film to be formed. On the other hand, introducing an excess amount of oxygen during sputtering lowers not only the sputtering rate but also the refractive index of the thin film to be formed. Thus, the amount of oxygen preferably is adjusted so that the extinction coefficient of the thin film becomes minimum.

As for the oxygen gas concentration during sputtering, oxygen preferably is present in at least 1% but not more than 10% in mole percentage when the mixed gas of argon gas and oxygen gas is used, for example. Although the thin film also can be formed using a sputtering target made of an oxygen-deficient material that needs 10% or more of oxygen gas as the gas for sputtering, the advantages of the high sputtering rate and the stability of the thin film, which are strong points of DC pulse discharge, are lessened. Therefore, it is preferable to use a sputtering target composition that allows the sputtering target to be sputtered with an oxygen gas concentration of 10% or less.

Hereinafter, a method for forming the transmittance adjusting layer 7 and methods for measuring the optical constants of the thin film (the transmittance adjusting layer) and the composition ratio of Bi, Ti, and O contained in the thin film.

For the sputtering target used for forming the transmittance adjusting layer 7, a sputtering target material preferably is used that contains $Bi_2O_3$, and $TiO_2$ and/or $TiO_x$ (x=1.6 to 1.8) as main components. The purpose of using $TiO_x$ as a component of the sputtering target material is to lower the resistance of the sputtering target and make DC pulse discharge possible. The sputtering target also may contain TiO and Ti other than $TiO_x$. Preferably, the sputtering target has a surface resistance of 5 $\Omega/cm^2$ or less.

The density of the sputtering target represents the filling rate of the powder. When the state in which powder is filled without any gap is defined as 100%, it is preferable that the sputtering target has a density of 80% or more from the viewpoint of increasing the deposition rate. It is more preferable for the sputtering target to have a higher density because it can shorten the period of time needed for reducing pressure from an atmospheric pressure to a pressure usable for sputtering.

Generally, the sputtering target is formed by sintering powders of the above-mentioned materials. However, even when the sputtering target is formed by a manufacturing method different from the sintering method, the sputtering rate, the optical constants of the thin film, and the composition ratio of Bi, Ti, and O contained in the thin film are likely to be almost equal to those of the sputtering target manufactured by the sintering method as long as the compositions of these sputtering targets are the same. Thus, the manufacturing method for the sputtering target does not limit the present invention. Even when the addition of an extremely small amount of additive during manufacturing allows the sputtering target to be manufactured by a different method from the sintering method, the thin film formed using this sputtering target still contains Bi, Ti, and O in the composition ratio specified in the present invention. Therefore, the manufacturing method for the sputtering target does not limit the present invention.

Preferably, DC pulse discharge is used for sputtering the sputtering target to stabilize the discharge. In order to increase the sputtering rate further, a method such as sputtering by DC discharge is preferable. However, when the thin film is formed using the material of which the transmittance adjusting layer 7 is formed in the present embodiment, it is necessary, for example, to mix a large amount of Ti material thereinto, which requires a large amount of oxygen to be introduced during spattering. Generally, when a material that can be bound to oxygen is sputtered reactively by DC sputtering, a non-conductive oxide film is formed on a surface of the sputtering target, making it difficult to continue the discharge. For this reason, DC pulse discharge is preferable.

Preferably, the pulse frequency for the DC pulse discharge appropriately is adjusted and decided according to the conductivity of the sputtering target surface. When the frequency is lowered, it takes longer time for the electric potential of the sputtering target to shift from 0 to a negative charge, and returns to 0 again. Specifically, the duration of discharge becomes longer locally. Thus, when the sputtering target surface has a high resistance, the surface easily is charged electrically, resulting in unstable sputtering. On the other hand, an excessively high frequency shortens the discharge duration locally, lowering the sputtering rate. In light of this, it is necessary to set the pulse frequency to be optimal for the sputtering target conductivity.

Also, it is necessary to optimize a pulse reverse time (interval between zero potentials) depending on the conductivity and pulse frequency of the sputtering target.

A higher sputtering power is more preferable from the viewpoint of increasing the sputtering rate. However, when the sputtering power is excessively high, heat tends to stay in the sputtering target and heat distortion is highly likely to damage the sputtering target. Preferably, magnetron sputtering is used for the sputtering because it can converge plasma and increase the sputtering rate.

Preferably, the gas to be introduced during sputtering is a gas containing a rare gas, such as Ar and Xe, as a main component, and a reactive gas, such as oxygen and nitrogen, added thereto.

The sputtering rate can be calculated as follows, for example. A thin film with a certain thickness is formed on a quartz substrate, the thickness is measured with, for example, a spectroscopic ellipsometer, and then the result is divided by the sputtering duration. Thus, the sputtering rate is obtained.

The optical constants of the thin film can be measured on, for example, the sample used for the sputtering rate calculation at an arbitrary wavelength by using the same spectroscopic ellipsometer.

The composition ratio of Bi, Ti, and O contained in the thin film can be analyzed as follows, for example. A thin film with a thickness of approximately 1 µm is formed on an Si substrate to produce a sample, and this sample is analyzed for composition ratio by using a wavelength dispersive X-ray microanalyzer.

Next, the optical separation layer 21 will be described. The optical separation layer 21 is provided for differentiating the focal position of the first information layer 10 and that of the second information layer 20. As the material for the optical separation layer 21, a photocurable resin or slow-acting thermosetting resin can be used. Preferably, the material for the optical separation layer 21 has low optical absorption with respect to the wavelength of the laser beam 30 used for recording and reproducing. The optical separation layer 21 needs to have a thickness equal to or larger than a focal depth $\Delta Z$ determined by the numerical aperture NA of an object lens and the wavelength $\lambda$ of the laser beam 30. Assuming that the reference value of optical intensity at the focal point is 80% of that obtained in the case of aberration free, $\Delta Z$ can be approximated by $\Delta Z = \lambda / \{2(NA)^2\}$. When $\lambda = 400$ nm and NA=0.6, $\Delta Z = 0.556$ µm, and ±0.6 µm from 0.556 µm is regarded to be within the focal depth. Accordingly, in this case, the thickness of the optical separation layer 21 needs to be 1.2 µm or more. The distance between the first information layer 10 and the second information layer 20 needs to fall within a range that allows the laser beam 30 to be focused via the object lens. Thus, the sum total of the thickness of the optical separation layer 21 and the thickness of the cover layer 1 falls preferably within the tolerance of the substrate thickness allowed by the object lens. Accordingly, the thickness of the optical separation layer 21 preferably is in a range of 1.2 µm to 50 µm.

The optical separation layer 21 can be formed by, for example, applying the photocurable resin or the slow-acting thermosetting resin on the second lower protective layer 12 of the second information layer 20 by spin coating, and then curing the resin. When the optical separation layer 21 is provided with guide grooves on a surface on the laser beam 30 incident side, the guide grooves can be formed by placing a substrate (mold) with grooves on the resin that has not been cured yet, curing the resin, and then separating the substrate (mold) therefrom.

The cover layer 1 has a function of protecting the thin film materials from the first lower interface layer 2 to the transmittance adjusting layer 7, and the thin film materials from the second lower protective layer 12 to the second reflective layer 17. The cover layer 1 can be formed by applying an ultraviolet curable resin, such as a polyester acrylate resin, by a spin coating method, and then curing the resin with ultraviolet ray.

It is possible to dispose, instead of the cover layer 1, a substrate functioning as an optical separation layer, and provide an additional information layer including the transmittance adjusting layer on the laser beam incident side of the substrate, although this is not illustrated. That is, although FIG. 1 shows the optical information recording medium including two information layers, the configuration of the present invention is applicable even when three or more information layers are provided. Specifically, it is possible that: the optical information recording medium of the present invention includes N information layers, where N is an integer satisfying $N \geq 2$; with the N information layers being referred to as a first information layer to an N-th information layer sequentially from the laser beam incident side, an L-th information layer included in the N information layers includes at least the recording layer and the transmittance adjusting layer in this order from the laser beam incident side, where L is at least an integer satisfying $1 \leq L \leq N-1$; and the transmittance adjusting layer has the same configuration as that of the transmittance adjusting layer 7 described in the present embodiment. Needless to say, the effects of the present invention are not reduced and the configuration of the present invention is still applicable even to such a multilayer optical information recording medium including a plurality of information layers. The present embodiment describes an example of the optical information recording medium including two information layers. However, the configuration of the present invention is applicable even in the case where only one information layer is provided.

EXAMPLE

Hereinafter, the optical information recording medium of the present invention will be described in further detail with reference to examples.

Example 1

The optical information recording medium of Example 1 was produced as follows. The optical information recording medium produced in the present example had the same film structure as that of the optical information recording medium 100 shown in FIG. 1, except that the first upper interface layer was provided further between the first recording layer 4 and the first upper protective layer 5. The optical information recording medium of the present example will be described below using the numerals shown in FIG. 1.

First, a 1.1 mm-thick polycarbonate substrate (120 mm in diameter and 1100 µm in thickness) with guide grooves transferred thereon was used as the first substrate 18.

Then, the second information layer 20 was formed on the polycarbonate substrate by stacking sequentially an Ag—Pd—Cu layer (100 nm in thickness) as the second reflective layer 17, a $ZrO_2$—$Cr_2O_3$ layer (12 nm in thickness) as the second upper protective layer 16, a $ZrO_2$—$SiO_2$—$Cr_2O_3$ layer (2 nm in thickness) as the second upper interface layer 15, an $Sb_{80}Ge_7Te_{13}$ layer (10 nm in thickness) as the second recording layer 14, a $ZrO_2$—$SiO_2$—$Cr_2O_3$ layer (5 nm in thickness) as the second lower interface layer 13, and a ZnS—$SiO_2$ layer (40 nm in thickness, ZnS 80 mol % and $SiO_2$ 20 mol %) as the second lower protective layer 12, by a sputtering method.

Next, in order to form the optical separation layer 21, the ultraviolet curable resin was applied on the second lower protective layer 12 by a spin coat method, the substrate (mold) with grooves was placed on the resin that had not been cured yet, and then the resin was cured. Subsequently, the substrate (mold) was separated therefrom. Thus, the optical separation layer 21 with the guide grooves was formed.

Next, the medium with the optical separation layer 21 was placed in an oven maintained at a temperature of 80° C. and a relative humidity of 1% for 4 hours, and then the medium was placed in a vacuum device. Thereafter, each of the films constituting the first information layer 10 was formed by sputtering.

The first information layer 10 was formed by stacking sequentially the transmittance adjusting layer 7 (14 nm to 25 nm in thickness), an Ag—Pd—Cu layer (10 nm in thickness) as the first reflective layer 6, a $ZrO_2$—$Cr_2O_3$ layer (12 nm in thickness) as the first upper protective layer 5, a $ZrO_2$—$SiO_2$—$Cr_2O_3$ layer (2 nm in thickness) as the first upper interface layer, a $Ge_{12}Bi_2Te_{15}$ layer (7 nm in thickness) as the first recording layer 4, a $ZrO_2$—$Cr_2O_3$ layer (5 nm in thickness) as the first lower interface layer 3, and a ZnS—$SiO_2$ layer (45 nm in thickness, ZnS 80 mol % and $SiO_2$ 20 mol %) as the first lower protective layer 2. Finally, the ultraviolet curable resin was applied on the first lower protective layer 2, a polycarbonate substrate (120 mm in diameter and 90 μm in thickness) was placed on the first lower protective layer 2 and subject to spin coating, and then it was irradiated with an ultraviolet ray to cure the resin. Thus, the cover layer 1 (75 μm in thickness) was formed.

The first reflective layer 6 and the second reflective layer 17 were formed using an $Ag_{97}Pd_2Cu_1$ (wt %) material (a mixture of 97 wt % of Ag, 2 wt % of Pd, and 1 wt % of Cu), by DC sputtering and with an Ar gas introduced.

The second upper protective layer 15, the first upper protective layer 5, and the first lower interface layer 3 were formed using a $(ZrO_2)_{50}(Cr_2O_3)_{50}$ (mol %) material by RF sputtering with an Ar gas introduced.

The second upper interface layer 17, the second lower interface layer 13, and the first upper interface layer were formed using a $(ZrO_2)_{50}(Cr_2O_3)_{50}$ (mol %) material by RF sputtering with an Ar gas introduced.

The second recording layer 14 was formed using a mixed material of $Sb_{80}Ge_7Te_{13}$ (atom %) by DC sputtering with an Ar gas introduced. "$Sb_{80}Ge_7Te_{13}$ (atom %)" is a composition formula, where the sum total of "Sb" atoms, "Ge" atoms, and "Te" atoms is taken as a reference (100%).

The first recording layer 4 was formed using a material obtained by mixing GeTe, SnTe, and $Bi_2Te_3$ at a molar ratio of 10:2:1, by DC sputtering with an Ar gas introduced.

The first lower protective layer 2 was formed using a material obtained by mixing ZnS and $SiO_2$ at a molar ratio of 4:1, by RF sputtering with an Ar gas introduced.

The cover layer 1 was formed using a polyester acrylate material.

The transmittance adjusting layer 7 of the present example was formed by sputtering, and the size of the sputtering target used was 200 mm in diameter×6 mm in thickness. It was proved that a pulse frequency of 120 Hz and a pulse reverse time of 0.4 μs can stabilize the electrical discharge without lowering the sputtering rate.

The transmittance adjusting layer 7 was formed to have a thickness of 18 nm, using a sputtering target obtained by mixing 20 mol % of $Bi_2O_3$ powder and 80 mol % of $TiO_x$ powder (x=1.6 to 1.8) as the sputtering target. In the present example, an electric power of 2.5 kW was used for sputtering. Moreover, magnetron sputtering was used for the sputtering.

In the present example, a gas containing inexpensive Ar gas as a main component was used, and oxygen gas was introduced in order to accelerate oxidation further when forming the thin film out of the sputtering target. The thin film (the transmittance adjusting layer 7) was formed with Ar gas flow rate being fixed at $3.3 \times 10^{-7}$ m$^3$/s (20 sccm), and with oxygen gas being introduced so that the oxygen concentration during sputtering was 3 vol %. At this time, the degree of vacuum in the film formation room was approximately $2 \times 10^{-1}$ Pa.

In the optical information recording medium of the present example thus produced, the first information layer 10 was evaluated for recording/reproducing characteristics. The evaluation method will be described hereinafter.

As the recording/reproducing apparatus, a recording/reproducing apparatus including a spindle motor for rotating the optical information recording medium, an optical head having a semiconductor laser, and an objective lens for focusing a laser beam emitted from the semiconductor laser.

First, common methods for recording, erasing, and overwrite recording with respect to the optical information recording medium will be described. Recording, erasing, and overwrite recording of information with respect to the optical information recording medium can be performed through modulation of the laser beam power between a peak power (Pp (mW)) of high power and a bias power (Pb (mW)) of low power. An amorphous phase is formed in a local area of the recording layer by irradiation with a laser beam of the peak power, and the amorphous phase serves as a mark. The region between the recording marks is irradiated with a laser beam of the bias power and thereby a crystalline phase (an erased area) is formed. In the case of irradiation with a laser beam of the peak power, it is common to employ a so-called multipulse composed of pulse trains. The multipulse may be modulated only at levels of the peak power and the bias power, or may be modulated at a level in a range of 0 mW to the peak power.

The power used as a reproducing power (Pr (mW)) has a power level lower than those of the peak power and bias power. The laser beam irradiation at the power level of the reproducing power does not affect the optical states of the recording marks, and makes it possible to obtain a sufficient amount of reflected light from the optical information recording medium to reproduce the recording marks. A detector detects the signals from the optical information recording medium, which are obtained by irradiation with the laser beam of the reproducing power. Thus, the information signals are reproduced.

The numerical aperture NA of the object lens preferably is in a range of 0.5 to 1.1 (more preferably in a range of 0.6 to 1.0) in order to adjust the spot diameter of the laser beam to fall within a range of 0.4 μm to 0.7 μm. The wavelength of the laser beam 16 preferably is 450 nm or less (more preferably in a range of 350 nm to 450 nm). The linear velocity at which information is recorded on or reproduced from the optical information recording medium preferably is in a range of 3 m/s to 20 m/s (more preferably in a range of 4 m/s to 15 m/s), in which crystallization tends not to be caused by a reproducing beam and a sufficiently high erasure rate can be obtained.

In the present example, the recording/reproducing characteristics were evaluated while the wavelength of the laser beam was 405 nm, the numerical aperture NA of the object lens was 0.85, the linear velocity of the sample during measurement was 9.8 m/s, the shortest mark length (2T) was 0.149 μm, the track pitch of the guide grooves formed on the optical separation layer 21 was 0.32 μm. Information was recorded in the grooves.

When recording was performed with respect to the first information layer 10, the laser beam was focused on the first recording layer 4, and the information was recorded on the first recording layer 4 by the laser beam transmitted through the cover layer 1. Reproduction was performed using the laser beam reflected by the first recording layer 4 and transmitted through the cover layer 1.

The recording performance was evaluated by recording 2T marks using a method of 1-7 pp modulation, and measuring the carrier to noise ratio (CNR) thereof with a spectrum analyzer. The erasing performance was evaluated by recording 2T marks using the method of 1-7 pp modulation, measuring the amplitude thereof with a spectrum analyzer, overwriting 9T marks thereon, measuring the amplitude of the 2T signal again, and calculating the extinction rate of the 2T signal. Hereinafter, this extinction rate of the 2T signal is referred to as an erasure rate.

As for the recording performance of the first information layer 10 of Example 1, the CNR was 46 dB and the erasure rate was 28 dB when Pp=12.0 mW and Pb=5.2 mW.

On the other hand, the corrosion resistance of the optical information recording medium was evaluated as follows. First, the optical information recording medium was placed in a thermostatic bath set at a temperature of 85° C. and a relative humidity of 85%, and was subject to a 100-hour accelerated test. Subsequently, the entire surface of the medium (a region stretching from a disc radius of 21 mm to the outermost of the disc) was observed for corrosion and separation with an optical microscope at 100 times magnification. As a result, no corrosion or separation was observed on the optical information recording medium of the present example, and satisfactory corrosion resistance was obtained.

Ten samples for measuring the sputtering rate were produced separately under the same sputtering conditions as those used when manufacturing the transmittance adjusting layer 7 of the present example. Specifically, a 18-mm-thick thin film was formed on a quartz substrate by using the same sputtering target as the one used for the transmittance adjusting layer 7 of the present example. Ten of these were produced to use as the samples for sputtering rate measurement. The thickness of the thin film was measured on each sample with a spectroscopic ellipsometer ("M-2000", manufactured by J. A. Woollam Japan, Co., Inc.), and the measured thickness was divided by the sputtering duration to calculate the sputtering rate. The calculated sputtering rate was 4.1 nm/s (average of the ten samples). The amount of variation in sputtering rate also was measured on the ten samples. The difference between the maximum sputtering rate value and the minimum sputtering rate value was divided by the average value, and the resulting value (%) was used as a variation rate of the sputtering rate. The variation rate of the sputtering rate in the Example 1 was 4.8%.

Optical constants of the thin film (the transmittance adjusting layer 7) at a wavelength of 405 nm were measured using the same sample as the one used for the sputtering rate measurement, with the spectroscopic ellipsometer ("M-2000" manufactured by J. A. Woollam Japan, Co., Inc.). As a result, the refractive index n1 was 2.75 and the extinction coefficient k1 was 0.03.

Separately, a sample for measuring the composition of the thin film (the transmittance adjusting layer 7) also was produced under the same sputtering conditions as those used for manufacturing the transmittance adjusting layer 7 of the present example. Specifically, an approximately 1 µm-thick thin film was formed on an Si substrate by using the same sputtering target as the one used for the transmittance adjusting layer 7 of the present example. The composition of the thin film was analyzed on this sample with the wavelength dispersive X-ray microanalyzer. As a result, the composition of the thin film (the transmittance adjusting layer 7) of the present example was composed of 11.8% of Bi, 23.5% of Ti, and 64.7% of O in atom %. This composition is denoted as $Bi_{0.118}Ti_{0.235}O_{0.647}$ in atomic number ratio, and $(Bi_2O_3)_{0.2}(TiO_2)_{0.8}$ in molar ratio of the oxides ($Bi_2O_3$ and $TiO_2$).

Example 2

The optical information recording media were produced in the same manner as in the Example 1, except that a sputtering target made of a mixture of 30 mol % of $Bi_2O_3$ powder and 70 mol % of $TiO_x$ powder (x=1.6 to 1.8) was used as the sputtering target for forming the transmittance adjusting layer 7. The optical information recording media of Example 2 also were measured for each of the properties by the same method as in Example 1 and evaluated for each of the characteristics.

In the Example 2, the sputtering rate was 5.8 nm/s (average of ten samples). As for the optical constants of the thin film (the transmittance adjusting layer) measured separately, the refractive index n1 was 2.77 and the extinction coefficient k1 was 0.03. The variation rate of the sputtering rate was 4.5% at this time.

When measured with the wavelength dispersive X-ray microanalyzer, the composition of the thin film (the transmittance adjusting layer) was composed of 16.6% of Bi, 19.3% of Ti, and 64.1% of O in atom %. This composition is denoted as $Bi_{0.166}Ti_{0.193}O_{0.641}$ in atomic number ratio, and $(Bi_2O_3)_{0.3}(TiO_2)_{0.7}$ in molar ratio of the oxides ($Bi_2O_3$ and $TiO_2$).

As for the recording performance of the optical information recording medium, the CNR was 47 dB and the erasure rate was 28 dB when Pp=12.1 mW and Pb=5.2 mW.

Neither corrosion nor separation was observed in the corrosion resistance evaluation.

Example 3

The optical information recording media were produced in the same manner as in the Example 1, except that a sputtering target made of a mixture of 40 mol % of $Bi_2O_3$ powder and 60 mol % of $TiO_x$ powder (x=1.6 to 1.8) was used as the sputtering target for forming the transmittance adjusting layer 7, and the oxygen concentration during sputtering was 2.5 vol %. The optical information recording media of Example 3 also were measured for each of the properties by the same method as in Example 1 and evaluated for each of the characteristics.

In the Example 3, the sputtering rate was 7.65 nm/s (average of ten samples). As for the optical constants of the thin film (the transmittance adjusting layer) measured separately, the refractive index n1 was 2.77 and the extinction coefficient k1 was 0.05. The variation rate of the sputtering rate was 4.0% at this time.

When measured with the wavelength dispersive X-ray microanalyzer, the composition of the thin film (the transmittance adjusting layer) was composed of 21.0% of Bi, 16.0% of Ti, and 63.0% of O in atom %. This composition is denoted as $Bi_{0.21}Ti_{0.16}O_{0.63}$ in atomic number ratio, and $(Bi_2O_3)_{0.4}(TiO_2)_{0.6}$ in molar ratio of the oxides ($Bi_2O_3$ and $TiO_2$).

As for the recording performance of the optical information recording medium, the CNR was 47 dB and the erasure rate was 28 dB when Pp=12.0 mW and Pb=5.2 mW.

Neither corrosion nor separation was observed in the corrosion resistance evaluation.

Example 4

The optical information recording media were produced in the same manner as in the Example 1, except that a sputtering target made of a mixture of 50 mol % of $Bi_2O_3$ powder and 50 mol % of $TiO_x$ powder (x=1.6 to 1.8) was used as the sputtering target for forming the transmittance adjusting layer 7, and the oxygen concentration during sputtering was 2.5 vol %. The optical information recording media of the Example 4 also were measured for each of the properties by the same method as in Example 1 and evaluated for each of the characteristics.

In the Example 4, the sputtering rate was 9.24 nm/s (average of ten samples). As for the optical constants of the thin film (the transmittance adjusting layer) measured separately, the refractive index was 2.77 and the extinction coefficient was 0.06. The variation rate of the sputtering rate was 3.5% at this time.

When measured with the wavelength dispersive X-ray microanalyzer, the composition of the thin film (the transmittance adjusting layer) was composed of 25.3% of Bi, 12.4% of Ti, and 62.3% of O in atom %. This composition is denoted as $Bi_{0.253}Ti_{0.124}O_{0.623}$ in atomic number ratio, and $(Bi_2O_3)_{0.5}(TiO_2)_{0.5}$ in molar ratio of the oxides ($Bi_2O_3$ and $TiO_2$).

As for the recording performance of the optical information recording medium, the CNR was 47 dB and the erasure rate was 28 dB when Pp=11.9 mW and Pb=5.2 mW.

Neither corrosion nor separation was observed in the corrosion resistance evaluation.

Example 5

The optical information recording media were produced in the same manner as in the Example 1, except that a sputtering target made of a mixture of 50 mol % of $Bi_2O_3$ powder, 45 mol % of $TiO_2$ powder, and 5 mol % of Ti powder was used as the sputtering target for forming the transmittance adjusting layer 7, and the oxygen concentration during sputtering was 2.5 vol %. The optical information recording media of the Example 5 also were measured for each of the properties by the same method as in Example 1 and evaluated for each of the characteristics.

In the Example 5, the sputtering rate was 9.15 nm/s (average of ten samples). As for the optical constants of the thin film (the transmittance adjusting layer) measured separately, the refractive index n1 was 2.74 and the extinction coefficient k1 was 0.07. The variation rate of the sputtering rate was 3.5% at this time.

When measured with the wavelength dispersive X-ray microanalyzer, the composition of the thin film (the transmittance adjusting layer) was composed of 25.2% of Bi, 12.3% of Ti, and 62.5% of O in atom %. This composition is denoted as $Bi_{0.252}Ti_{0.123}O_{0.625}$ in atomic number ratio, and $(Bi_2O_3)_{0.51}(TiO_2)_{0.49}$ in molar ratio of the oxides ($Bi_2O_3$ and $TiO_2$).

As for the recording performance of the optical information recording medium, the CNR was 47 dB and the erasure rate was 28 dB when Pp=12.0 mW and Pb=5.2 mW.

Neither corrosion nor separation was observed in the corrosion resistance evaluation.

Example 6

The optical information recording media were produced in the same manner as in the Example 1, except that a sputtering target made of a mixture of 50 mol % $Bi_2O_3$ powder, 40 mol % of $TiO_2$ powder, and 10 mol % of TiO powder was used as the sputtering target for forming the transmittance adjusting layer 7, and the oxygen concentration during sputtering was 2.5 vol %. The optical information recording media of the Example 6 also were measured for each of the properties by the same method as in Example 1 and evaluated for each of the characteristics.

In the Example 6, the sputtering rate was 9.22 nm/s (average of ten samples). As for the optical constants of the thin film (the transmittance adjusting layer) measured separately, the refractive index n1 was 2.78 and the extinction coefficient k1 was 0.05. The variation rate of the sputtering rate was 3.5% at this time.

When measured with the wavelength dispersive X-ray microanalyzer, the composition of the thin film (the transmittance adjusting layer) was composed of 25.4% of Bi, 12.5% of Ti, and 62.1% of O in atom %. This composition is denoted as $Bi_{0.254}Ti_{0.125}O_{0.621}$ in atomic number ratio, and $(Bi_2O_3)_{0.5}(TiO_2)_{0.5}$ in molar ratio of the oxides ($Bi_2O_3$ and $TiO_2$).

As for the recording performance of the optical information recording medium, the CNR was 47 dB and the erasure rate was 28 dB when Pp=12.0 mW and Pb=5.2 mW.

Neither corrosion nor separation was observed in the corrosion resistance evaluation.

Example 7

The optical information recording media were produced in the same manner as in the Example 1, except that a sputtering target made of a mixture of 60 mol % of $Bi_2O_3$ powder and 40 mol % of $TiO_x$ powder (x=1.6 to 1.8) was used as the sputtering target for forming the transmittance adjusting layer 7, and the oxygen concentration during sputtering was 2.0 vol %. The optical information recording media of the Example 7 also were measured for each of the properties by the same method as in Example 1 and evaluated for each of the characteristics.

In the Example 7, the sputtering rate was 10.8 nm/s (average of ten samples). As for the optical constants of the thin film (the transmittance adjusting layer) measured separately, the refractive index n1 was 2.80 and the extinction coefficient k1 was 0.07. The variation rate of the sputtering rate was 3.0% at this time.

When measured with the wavelength dispersive X-ray microanalyzer, the composition of the thin film (the transmittance adjusting layer) was composed of 28.5% of Bi, 9.5% of Ti, and 62.0% of O in atom %. This composition is denoted as $Bi_{0.285}Ti_{0.095}O_{0.62}$ in atomic number ratio, and $(Bi_2O_3)_{0.6}(TiO_2)_{0.4}$ in molar ratio of the oxides ($Bi_2O_3$ and $TiO_2$).

As for the recording performance of the optical information recording medium, the CNR was 47 dB and the erasure rate was 28 dB when Pp=11.8 mW and Pb=5.0 mW.

Neither corrosion nor separation was observed in the corrosion resistance evaluation.

Example 8

The optical information recording media were produced in the same manner as in the Example 1, except that a sputtering target made of a mixture of 60 mol % of $Bi_2O_3$ powder, 35 mol % of $TiO_2$ powder, and 5 mol % of Ti powder was used as the sputtering target for forming the transmittance adjusting layer 7, and the oxygen concentration during sputtering was 2.0 vol %. The optical information recording media of the Example 8 also were measured for each of the properties by the same method as in Example 1 and evaluated for each of the characteristics.

In the Example 8, the sputtering rate was 10.3 nm/s (average of ten samples). As for the optical constants of the thin film (the transmittance adjusting layer) measured separately, the refractive index n1 was 2.82 and the extinction coefficient k1 was 0.06. The variation rate of the sputtering rate was 3.0% at this time.

When measured with the wavelength dispersive X-ray microanalyzer, the composition of the thin film (the transmittance adjusting layer) was composed of 28.6% of Bi, 9.5% of Ti, and 61.9% of O in atom %. This composition is denoted as $Bi_{0.286}Ti_{0.095}O_{0.619}$ in atomic number ratio, and $(Bi_2O_3)_{0.6}(TiO_2)_{0.4}$ in molar ratio of the oxides ($Bi_2O_3$ and $TiO_2$).

As for the recording performance of the optical information recording medium, the CNR was 47 dB and the erasure rate was 28 dB when Pp=11.8 mW and Pb=5.0 mW.

Neither corrosion nor separation was observed in the corrosion resistance evaluation.

Example 9

The optical information recording media were produced in the same manner as in the Example 1, except that a sputtering target made of a mixture of 60 mol % of $Bi_2O_3$ powder, 30 mol % of $TiO_2$ powder, and 10 mol % of TiO powder was used as the sputtering target for forming the transmittance adjusting layer 7, and the oxygen concentration during sputtering was 2.0 vol %. The optical information recording media of the Example 9 also were measured for each of the properties by the same method as in Example 1 and evaluated for each of the characteristics.

In the Example 9, the sputtering rate was 10.5 nm/s (average of ten samples). As for the optical constants of the thin film (the transmittance adjusting layer) measured separately, the refractive index n1 was 2.81 and the extinction coefficient k1 was 0.07. The variation rate of the sputtering rate was 3.0% at this time.

When measured with the wavelength dispersive X-ray microanalyzer, the composition of the thin film (the transmittance adjusting layer) was composed of 28.7% of Bi, 9.4% of Ti, and 61.9% of O in atom %. This composition is denoted as $Bi_{0.287}Ti_{0.094}O_{0.619}$ in atomic number ratio, and $(Bi_2O_3)_{0.6}(TiO_2)_{0.4}$ in molar ratio of the oxides ($Bi_2O_3$ and $TiO_2$).

As for the recording performance of the optical information recording medium, the CNR was 47 dB and the erasure rate was 28 dB when Pp=11.7 mW and Pb=4.9 mW.

Neither corrosion nor separation was observed in the corrosion resistance evaluation.

Example 10

The optical information recording media were produced in the same manner as in the Example 1, except that a sputtering target made of a mixture of 70 mol % of $Bi_2O_3$ powder and 30 mol % of $TiO_x$ powder (x=1.6 to 1.8) was used as the sputtering target for forming the transmittance adjusting layer 7, and the oxygen concentration during sputtering was 2.0 vol %. The optical information recording media of the Example 10 also were measured for each of the properties by the same method as in Example 1 and evaluated for each of the characteristics.

In the Example 10, the sputtering rate was 12.4 nm/s (average of ten samples). As for the optical constants of the thin film (the transmittance adjusting layer) measured separately, the refractive index n1 was 2.85 and the extinction coefficient k1 was 0.10. The variation rate of the sputtering rate was 2.5% at this time.

When measured with the wavelength dispersive X-ray microanalyzer, the composition of the thin film (the transmittance adjusting layer) was composed of 31.6% of Bi, 7.0% of Ti, and 61.4% of O in atom %. This composition is denoted as $Bi_{0.316}Ti_{0.07}O_{0.614}$ in atomic number ratio, and $(Bi_2O_3)_{0.69}(TiO_2)_{0.31}$ in molar ratio of the oxides ($Bi_2O_3$ and $TiO_2$).

As for the recording performance of the optical information recording medium, the CNR was 47 dB and the erasure rate was 28 dB when Pp=11.6 mW and Pb=4.8 mW.

Three corroded points, each of which is an approximately 10 μm square, were observed in the corrosion resistance evaluation.

Example 11

The optical information recording media were produced in the same manner as in the Example 1, except that a sputtering target made of a mixture of 38.5 mol % of $Bi_2O_3$ powder, 57.9 mol % of $TiO_x$ powder (x=1.6 to 1.8), 1.2 mol % of $SiO_2$ powder, 1.2 mol % of $ZrO_2$ powder, and 1.2 mol % of $Cr_2O_3$ powder was used as the sputtering target for forming the transmittance adjusting layer 7, and the oxygen concentration during sputtering was 2.5 vol %. The optical information recording media of the Example 11 also were measured for each of the properties by the same method as in Example 1 and evaluated for each of the characteristics.

In the Example 11, the sputtering rate was 7.50 nm/s (average of ten samples). As for the optical constants of the thin film (the transmittance adjusting layer) measured separately, the refractive index n1 was 2.70 and the extinction coefficient k1 was 0.06. The variation rate of the sputtering rate was 4.0% at this time.

When measured with the wavelength dispersive X-ray microanalyzer, the composition of the thin film (the transmittance adjusting layer) was composed of 19.8% of Bi, 14.2% of Ti, and 62.0% of O in atom %.

As elements other than Bi, Ti, and O, 1.0% of Si, 1.1% of Zr, and 1.9% of Cr were detected. This composition is denoted as $Bi_{0.198}Ti_{0.142}O_{0.62}M_{0.04}$ (M=Si+Zr+Cr) in atomic number ratio.

As for the recording performance of the optical information recording medium, the CNR was 47 dB and the erasure rate was 28 dB when Pp=12.0 mW and Pb=5.2 mW.

Neither corrosion nor separation was observed in the corrosion resistance evaluation.

Comparative Example 1

The media were produced in the same manner as in the Example 1, except that a $TiO_2$ sputtering target was used as the sputtering target material for forming the transmittance adjusting layer, the sputtering target was placed on an RF cathode and spattered at RF 2.5 kW, Ar was used as the gas introduced during spattering, and the transmittance adjusting layer was formed to have a thickness of 18 nm. The optical information recording media of the Comparative Example 1 also were measured for each of the properties by the same method as in Example 1 and evaluated for each of the characteristics.

In the Comparative Example 1, the sputtering rate was 1.7 nm/s (average of ten samples). As for the optical constants of the thin film (the transmittance adjusting layer), the refractive index n1 was 2.71, and the extinction coefficient k1 was 0.03. The variation rate of the sputtering rate was 7.0% at this time.

When measured with the wavelength dispersive X-ray microanalyzer, the composition of the thin film (the transmittance adjusting layer) was composed of 33.6% of Ti and 66.4% of O in atom %.

As for the recording performance, the CNR was 46 dB and the erasure rate was 28 dB when Pp=12.0 mW and Pb=5.2 mW.

Neither corrosion nor separation was observed in the corrosion resistance evaluation.

Comparative Example 2

The optical information recording media were produced in the same manner as in the Comparative Example 1, except that a mixed gas of Ar and oxygen was used as the gas introduced during spattering and the oxygen concentration was 1.5 vol % when forming the transmittance adjusting layer. The optical information recording media of the Comparative Example 2 also were measured for each of the properties by the same method as in Example 1 and evaluated for each of the characteristics.

In the Comparative Example 2, the sputtering rate was 1.5 nm/s (average of ten samples). As for the optical constants of the thin film (the transmittance adjusting layer) measured separately, the refractive index n1 was 2.70 and the extinction coefficient k1 was 0.02. The variation rate of the sputtering rate was 7.0% at this time.

When measured with the wavelength dispersive X-ray microanalyzer, the composition of the thin film (the transmittance adjusting layer) was composed of 33.3% of Ti and 66.7% of O in atom %.

As for the recording performance of the optical information recording medium, the CNR was 46 dB and the erasure rate was 28 dB when Pp=12.0 mW and Pb=5.2 mW.

Neither corrosion nor separation was observed in the corrosion resistance evaluation.

Comparative Example 3

The optical information recording media were produced in the same manner as in the Comparative Example 1, except that a $Bi_2O_3$ sputtering target was used as the sputtering target material for forming the transmittance adjusting layer, and the sputtering target was placed on an RF cathode and spattered at RF 2.5 kW. The optical information recording media of the Comparative Example 3 also were measured for each of the properties by the same method as in Example 1 and evaluated for each of the characteristics.

In the Comparative Example 3, the sputtering rate was 15.0 nm/s (average of ten samples). As for the optical constants of the thin film (the transmittance adjusting layer) measured separately, the refractive index n1 was 2.92, and the extinction coefficient k1 was 0.33. The variation rate of the sputtering rate was 0.5% at this time.

When measured with the wavelength dispersive X-ray microanalyzer, the composition of the thin film (the transmittance adjusting layer) was composed of 40.2% of Bi and 59.8% of O in atom %.

As for the recording performance of the optical information recording medium, the CNR was 43 dB and the erasure rate was 23 dB when Pp=11.4 mW, Pb=4.3 mW.

Corrosion and separation were observed on entire surface of the medium in the corrosion resistance evaluation.

Comparative Example 4

The optical information recording media were produced in the same manner as in the Comparative Example 3, except that a mixed gas of Ar and oxygen was used as the gas introduced during spattering and the oxygen concentration was 1.0 vol % when forming the transmittance adjusting layer. The optical information recording media of the Comparative Example 4 also were measured for each of the properties by the same method as in Example 1 and evaluated for each of the characteristics.

In the Comparative Example 4, the sputtering rate was 14.8 nm/s (average of ten samples). As for the optical constants of the thin film (the transmittance adjusting layer) measured separately, the refractive index n1 was 2.93 and the extinction coefficient k1 was 0.30. The variation rate of the sputtering rate was 0.5% at this time.

When measured with the wavelength dispersive X-ray microanalyzer, the composition of the thin film (the transmittance adjusting layer) was composed of 40.2% of Ti and 59.8% of O in atom %.

As for the recording performance of the optical information recording medium, the CNR was 43 dB and the erasure rate was 23 dB when Pp=11.4 mW and Pb=4.3 mW.

Corrosion and separation were observed on entire surface of the medium in the corrosion resistance evaluation.

Comparative Example 5

The optical information recording media were produced in the same manner as in the Comparative Example 3, except that a mixed gas of Ar and oxygen was used as the gas introduced during spattering and the oxygen concentration was 2.0 vol % when forming the transmittance adjusting layer. The optical information recording media of the Comparative Example 5 also were measured for each of the properties by the same method as in Example 1 and evaluated for each of the characteristics.

In the Comparative Example 5, the sputtering rate was 14.4 nm/s (average of ten samples). As for the optical constants of the thin film (the transmittance adjusting layer) measured separately, the refractive index n1 was 2.82, and the extinction coefficient k1 was 0.34. The variation rate of the sputtering rate was 0.5% at this time.

When measured with the wavelength dispersive X-ray microanalyzer, the composition of the thin film (the transmittance adjusting layer) was composed of 40.2% of Ti and 59.8% of O in atom %.

As for the recording performance of the optical information recording medium, the CNR was 42 dB and the erasure rate was 21 dB when Pp=11.4 mW and Pb=4.3 mW.

Corrosion and separation were observed on entire surface of the medium in the corrosion resistance evaluation.

When the thin films are formed using the sputtering target material made of only $Bi_2O_3$ as described in the Comparative Examples 3 to 5, the sputtering rate and the refractive index were higher than when the thin films are formed using the sputtering target material made of $TiO_2$. However, when the thin films were formed using the sputtering target material made of only $Bi_2O_3$, their extinction coefficients were high. Moreover, as for the corrosion resistance of the media, corrosion and separation were observed on entire surface of the medium.

Comparative Example 6

The optical information recording media were produced in the same manner as in the Comparative Example 1, except that a $TiO_x$ sputtering target (x=1.6 to 1.8) was used as the sputtering target material for forming the transmittance adjusting layer, and the sputtering target was placed on a DCp (Direct Current Pulse) cathode to be spattered at DCp 2.5 kW. The optical information recording media of the Comparative Example 6 also were measured for each of the properties by the same method as in Example 1 and evaluated for each of the characteristics. In the Comparative Example 6, the sputtering rate was 2.7 nm/s (average of ten samples). As for the optical constants of the thin film (the transmittance adjusting layer) measured separately, the refractive index n1 was 2.58 and the extinction coefficient k1 was 0.15. The variation rate of the sputtering rate was 7.5% at this time.

When measured with the wavelength dispersive X-ray microanalyzer, the composition of the thin film (the transmittance adjusting layer) was composed of 35.2% of Ti and 64.8% of O in atom %.

As for the recording performance of the optical information recording medium, the CNR was 44 dB and the erasure rate was 25 dB when Pp=11.6 mW and Pb=4.6 mW.

Neither corrosion nor separation was observed in the corrosion resistance evaluation.

Comparative Example 7

The optical information recording media were produced in the same manner as in the Comparative Example 6, except that a mixed gas of Ar and oxygen was used as the gas introduced during spattering and the oxygen concentration was 3.0 vol % when forming the transmittance adjusting layer. The optical information recording media of the Comparative Example 7 also were measured for each of the properties by the same method as in Example 1 and evaluated for each of the characteristics.

In the Comparative Example 7, the sputtering rate was 2.35 nm/s (average of ten samples). As for the optical constants of the thin film (the transmittance adjusting layer) measured separately, the refractive index n1 was 2.72 and the extinction coefficient k1 was 0.03. The variation rate of the sputtering rate was 7.5% at this time.

When measured with the wavelength dispersive X-ray microanalyzer, the composition of the thin film (the transmittance adjusting layer) was composed of 33.3% of Ti and 66.7% of O in atom %.

As for the recording performance of the optical information recording medium, the CNR was 46 dB and the erasure rate was 28 dB when Pp=12.2 mW and Pb=5.3 mW.

Neither corrosion nor separation was observed in the corrosion resistance evaluation.

Comparative Example 8

The optical information recording media were produced in the same manner as in the Comparative Example 6, except that a mixed gas of Ar and oxygen was used as the gas introduced during spattering and the oxygen concentration was 5.0 vol % when forming the transmittance adjusting layer. The optical information recording media of the Comparative Example 8 also were measured for each of the properties by the same method as in Example 1 and evaluated for each of the characteristics.

In the Comparative Example 8, the sputtering rate was 1.60 nm/s (average of ten samples). As for the optical constants of the thin film (the transmittance adjusting layer) measured separately, the refractive index n1 was 2.65 and the extinction coefficient k1 was 0.02. The variation rate of the sputtering rate was 7.5% at this time.

When measured with the wavelength dispersive X-ray microanalyzer, the composition of the thin film (the transmittance adjusting layer) was composed of 33.3% of Ti and 66.7% of O in atom %.

As for the recording performance of the optical information recording medium, the CNR was 46 dB and the erasure rate was 28 dB when Pp=12.2 mW and Pb=5.3 mW.

Neither corrosion nor separation was observed in the corrosion resistance evaluation.

When the sputtering target material made of $TiO_x$ (x=1.6 to 1.8) was sputtered by DCp discharge as described in the Comparative Examples 6 to 8, the optical constants of the thin films (the transmittance adjusting layers) and the corrosion resistances of the media were satisfactory. In this case, however, the sputtering rate did not reach a level that is high enough to ensure sufficiently the mass productivity of the medium, although the sputtering rate was somewhat higher than in the cases (the Comparative Examples 1 and 2) where RF discharge was performed.

Comparative Example 9

The thin films and the optical information recording media were produced in the same manner as in the Comparative Example 6, except that a sputtering target made of a mixture of 10 mol % of $Bi_2O_3$ powder and 90 mol % of $TiO_x$ powder (x=1.6 to 1.8) was used as the sputtering target for forming the transmittance adjusting layer, and the oxygen concentration during sputtering was 3.0 vol %. The optical information recording media of the Comparative Example 9 also were measured for each of the properties by the same method as in Example 1 and evaluated for each of the characteristics.

In the Comparative Example 8, the sputtering rate was 2.94 nm/s (average of ten samples). As for the optical constants of the thin film (the transmittance adjusting layer) measured separately, the refractive index n1 was 2.71 and the extinction coefficient k1 was 0.03. The variation rate of the sputtering rate was 6.5% at this time.

When measured with the wavelength dispersive X-ray microanalyzer, the composition of the thin film (the transmittance adjusting layer) was composed of 6.3% of Bi, 28.1% of Ti, and 65.6% of O in atom %. This composition is denoted as $Bi_{0.063}Ti_{0.281}O_{0.656}$ in atomic number ratio, and $(Bi_2O_3)_{0.1}(TiO_2)_{0.9}$ in molar ratio of the oxides ($Bi_2O_3$ and $TiO_2$).

As for the recording performance of the optical information recording medium, the CNR was 46 dB and the erasure rate was 28 dB when Pp=12.2 mW and Pb=5.3 mW.

Neither corrosion nor separation was observed in the corrosion resistance evaluation.

In the present comparative example, the optical constants of the thin film (the transmittance adjusting layer) and the corrosion resistance of the medium were satisfactory. However, the sputtering rate did not reach a level that is high enough to ensure sufficiently the mass productivity of the medium, although the sputtering rate was somewhat higher than in the Comparative Examples 6 to 8.

Comparative Example 10

The optical information recording media were produced in the same manner as in the Comparative Example 6, except that a sputtering target made of a mixture of 80 mol % of $Bi_2O_3$ powder, 10 mol % of $TiO_x$ powder (x=1.6 to 1.8), and 10 mol % of TiO powder was used as the sputtering target for forming the transmittance adjusting layer, and the oxygen concentration during sputtering was 3.5 vol %. The optical information recording media of the Comparative Example 10 also were measured for each of the properties by the same method as in Example 1 and evaluated for each of the characteristics.

In the Comparative Example 10, the sputtering rate was 14.3 nm/s (average of ten samples). As for the optical constants of the thin film (the transmittance adjusting layer) measured separately, the refractive index n1 was 2.90, and the extinction coefficient k1 was 0.14. The variation rate of the sputtering rate was 1.5% at this time.

When measured with the wavelength dispersive X-ray microanalyzer, the composition of the thin film (the transmittance adjusting layer) was composed of 35.1% of Bi, 4.2% of Ti, and 60.7% of O in atom %. This composition is denoted as $Bi_{0.351}Ti_{0.042}O_{0.607}$ in atomic number ratio, and $(Bi_2O_3)_{0.81}(TiO_2)_{0.19}$ in molar ratio of the oxides ($Bi_2O_3$ and $TiO_2$).

As for the recording performance of the optical information recording medium, the CNR was 44 dB and the erasure rate was 26 dB when Pp=11.8 mW and Pb=4.9 mW.

Corrosion and separation were observed on entire surface of the medium in the corrosion resistance evaluation.

In the present comparative example, the thin film (the transmittance adjusting layer) has a higher refractive index and higher sputtering rate than those of the thin films in the Comparative Examples 6 to 8 in which $TiO_x$ (x=1.6 to 1.8) was used as the sputtering target material. In the present comparative example, however, the extinction coefficient was as high as 0.1 or more, and the corrosion resistance of the medium was low.

Table 1 summarizes the results of the Examples 1 to 11 and the results of the Comparative Examples 1 to 10 described above.

Regarding the medium characteristics, ○ indicates that the CNR was 45 dB or more and the ensure rate was 25 dB or more, Δ indicates that CNR was less than 45 dB or the erasure

TABLE 1

| Example | Sputtering target composition (mol %) | | | | | | Discharge electrode | Oxygen concentration (vol %) | Deposition rate (nm/s) | Evaluation on deposition rate | Variation rate of deposition rate (%) | Evaluation on variation rate of deposition rate |
|---|---|---|---|---|---|---|---|---|---|---|---|---|
| | $Bi_2O_3$ | $TiO_2$ | $TiO_{1.6-1.8}$ | TiO | Ti | Bi | | | | | | |
| Example 1 | 20 | 0 | 80 | 0 | 0 | 0 | DCp | 3.0% | 4.10 | ○ | 4.8 | ○ |
| Example 2 | 30 | 0 | 70 | 0 | 0 | 0 | DCp | 3.0% | 5.80 | ○ | 4.5 | ○ |
| Example 3 | 40 | 0 | 60 | 0 | 0 | 0 | DCp | 2.5% | 7.65 | ○ | 4.0 | ○ |
| Example 4 | 50 | 0 | 50 | 0 | 0 | 0 | DCp | 2.5% | 9.24 | ○ | 3.5 | ○ |
| Example 5 | 50 | 45 | 0 | 0 | 5 | 0 | DCp | 2.5% | 9.15 | ○ | 3.5 | ○ |
| Example 6 | 50 | 40 | 0 | 10 | 0 | 0 | DCp | 2.5% | 9.22 | ○ | 3.5 | ○ |
| Example 7 | 60 | 0 | 40 | 0 | 0 | 0 | DCp | 2.0% | 10.8 | ○ | 3.0 | ○ |
| Example 8 | 60 | 35 | 0 | 0 | 5 | 0 | DCp | 2.0% | 10.3 | ○ | 3.0 | ○ |
| Example 9 | 60 | 30 | 0 | 10 | 0 | 0 | DCp | 2.0% | 10.5 | ○ | 3.0 | ○ |
| Example 10 | 70 | 0 | 30 | 0 | 0 | 0 | DCp | 2.0% | 12.4 | ○ | 2.5 | ○ |
| Example 11 | 38.5 | 0 | 57.9 | 0 | 0 | 0 | DCp | 2.5% | 7.50 | ○ | 4.0 | ○ |
| C. Example 1 | 0 | 100 | 0 | 0 | 0 | 0 | RF | 0.0% | 1.70 | X | 7.0 | X |
| C. Example 2 | 0 | 100 | 0 | 0 | 0 | 0 | RF | 1.5% | 1.50 | X | 7.0 | X |
| C. Example 3 | 100 | 0 | 0 | 0 | 0 | 0 | RF | 0.0% | 15.0 | ○ | 0.5 | ○ |
| C. Example 4 | 100 | 0 | 0 | 0 | 0 | 0 | RF | 1.0% | 14.8 | ○ | 0.5 | ○ |
| C. Example 5 | 100 | 0 | 0 | 0 | 0 | 0 | RF | 2.0% | 14.4 | ○ | 0.5 | ○ |
| C. Example 6 | 0 | 0 | 100 | 0 | 0 | 0 | DCp | 0.0% | 2.70 | X | 7.5 | X |
| C. Example 7 | 0 | 0 | 100 | 0 | 0 | 0 | DCp | 3.0% | 2.35 | X | 7.5 | X |
| C. Example 8 | 0 | 0 | 100 | 0 | 0 | 0 | DCp | 5.0% | 1.60 | X | 7.5 | X |
| C. Example 9 | 10 | 0 | 90 | 0 | 0 | 0 | DCp | 3.0% | 2.94 | X | 6.5 | X |
| C. Example 10 | 80 | 0 | 10 | 10 | 0 | 0 | DCp | 3.5% | 14.3 | ○ | 1.5 | ○ |

| Example | Optical constant of thin film (n1-ik1) | Evaluation | Density analysis (atom %) | | | | $(Bi_2O_3)_\alpha(TiO_2)_\beta$ | | Corrosion resistance of medium (100 h) | Characteristics of medium | Comprehensive evaluation |
|---|---|---|---|---|---|---|---|---|---|---|---|
| | | | Bi | Ti | O | Others | α | β | | | |
| Example 1 | 2.75-i0.03 | ○ | 11.8% | 23.5% | 64.7% | 0.0% | 0.20 | 0.80 | ○ | ○ | ○ |
| Example 2 | 2.77-i0.03 | ○ | 16.6% | 19.3% | 64.1% | 0.0% | 0.30 | 0.70 | ○ | ○ | ○ |
| Example 3 | 2.77-i0.05 | ○ | 21.0% | 16.0% | 63.0% | 0.0% | 0.40 | 0.60 | ○ | ○ | ○ |
| Example 4 | 2.77-i0.06 | ○ | 25.3% | 12.4% | 62.3% | 0.0% | 0.50 | 0.50 | ○ | ○ | ○ |
| Example 5 | 2.74-i0.07 | ○ | 25.2% | 12.3% | 62.5% | 0.0% | 0.51 | 0.49 | ○ | ○ | ○ |
| Example 6 | 2.78-i0.05 | ○ | 25.4% | 12.5% | 62.1% | 0.0% | 0.50 | 0.50 | ○ | ○ | ○ |
| Example 7 | 2.80-i0.07 | ○ | 28.5% | 9.5% | 62.0% | 0.0% | 0.60 | 0.40 | ○ | ○ | ○ |
| Example 8 | 2.82-i0.06 | ○ | 28.6% | 9.5% | 61.9% | 0.0% | 0.60 | 0.40 | ○ | ○ | ○ |
| Example 9 | 2.81-i0.07 | ○ | 28.7% | 9.4% | 61.9% | 0.0% | 0.60 | 0.40 | ○ | ○ | ○ |
| Example 10 | 2.85-i0.10 | Δ | 31.6% | 7.0% | 61.4% | 0.0% | 0.69 | 0.31 | ○ | Δ | ○ |
| Example 11 | 2.70-i0.06 | ○ | 19.8% | 14.2% | 62.0% | 4.0% | — | — | ○ | ○ | ○ |
| C. Example 1 | 2.71-i0.03 | ○ | 0.0% | 33.6% | 66.4% | 0.0% | 0.00 | 1.00 | ○ | ○ | X |
| C. Example 2 | 2.70-i0.02 | ○ | 0.0% | 33.3% | 66.7% | 0.0% | 0.00 | 1.00 | ○ | ○ | X |
| C. Example 3 | 2.92-i0.33 | X | 40.2% | 0.0% | 59.8% | 0.0% | 1.00 | 0.00 | X | X | X |
| C. Example 4 | 2.93-i0.30 | X | 40.2% | 0.0% | 59.8% | 0.0% | 1.00 | 0.00 | X | X | X |
| C. Example 5 | 2.82-i0.34 | X | 40.2% | 0.0% | 59.8% | 0.0% | 1.00 | 0.00 | X | X | X |
| C. Example 6 | 2.58-i0.15 | X | 0.0% | 35.2% | 64.8% | 0.0% | 0.00 | 1.00 | X | ○ | X |
| C. Example 7 | 2.72-i0.03 | ○ | 0.0% | 33.3% | 66.7% | 0.0% | 0.00 | 1.00 | ○ | ○ | X |
| C. Example 8 | 2.65-i0.02 | ○ | 0.0% | 33.3% | 66.7% | 0.0% | 0.00 | 1.00 | ○ | ○ | X |
| C. Example 9 | 2.71-i0.03 | ○ | 6.3% | 28.1% | 65.6% | 0.0% | 0.10 | 0.90 | ○ | ○ | X |
| C. Example 10 | 2.90-i0.14 | X | 35.1% | 4.2% | 60.7% | 0.0% | 0.81 | 0.19 | X | X | X |

The evaluations shown in Table 1 will be described.

Regarding the sputtering rate, x indicates equal to or less than 2.35 nm/s, which is the value of Comparative Example 7, and less than 1.5 times of 2.35 nm/s, and ○ indicates equal to or more than 1.5 times of 2.35 nm/s. Regarding the variation rate of the sputtering rate, ○ indicates less than 5%, and x indicates 5% or more.

Regarding the extinction coefficient, which is one of the optical constants of the thin film (the transmittance adjusting layer), ○ indicates less than 0.1, Δ indicates equal to 0.1, and x indicates more than 0.1.

Regarding the corrosion resistance of the medium, ○ indicates that no corrosion was observed or the number of corroded points was less than ten, and x indicates that corrosion was observed on entire surface of the medium.

rate was less than 25 dB, x indicates that the CNR was less than 45 dB and the erasure rate was less than 25 dB.

In the comprehensive evaluation, ○ indicates that all the items were evaluated as ○ or Δ, and x indicates that at least one item was evaluated as x.

As shown in Table 1, the transmittance adjusting layers 7 used in the Examples 1 to 11 all were evaluated as ○ for the sputtering rate, the optical constants of the thin film (the transmittance adjusting layer), and the variation rate of the spattering rate, as well as for the recording/reproducing characteristics and the corrosion resistance of the optical information recording medium. Also, they were evaluated as ○ or Δ for the characteristics of the medium.

On the other hand, none of the transmittance adjusting layers used in the Comparative Examples 1 to 10 was evaluated as ○ for all items. As a result, the effects of the present invention were proved.

The reliability in analysis using the wavelength dispersive X-ray microanalyzer will be described hereinafter.

On the thin film formed on the Si wafer, which was used as a measurement sample in this example, a measurement accuracy of ±0.5 atom % was proved for all the elements. Moreover, as a sample for a qualitative analysis, it also is possible to use a sample obtained by slicing a cross section of the optical information recording medium at a thickness of 100 nm. In this case, the microanalyzer was proved to be able to measure oxygen with an accuracy of approximately ±8 atom % and the ratio of Bi and Ti with an accuracy of ±5 atom %, although quantification of each of the elements Bi, Ti, and O is difficult.

The results shown in Table 1 prove that the optical information recording medium using the transmittance adjusting layer 7 whose composition is denoted as $Bi_xTi_yO_z$, in atomic number ratio, where x, y, and z satisfy $0.07 \leq x \leq 0.35$, $0.07 \leq y \leq 0.28$, $0.56 \leq z \leq 0.70$, and $x+y+z=1$, and the optical information recording medium using the transmittance adjusting layer 7 whose composition is denoted as $(Bi_2O_3)_\alpha (TiO_2)_\beta$, where $\alpha$ and $\beta$ satisfy $0.2 \leq \alpha \leq 0.7$, $0.3 \leq \beta \leq 0.8$, and $\alpha+\beta=1$, both are optical information recording media with well-balanced characteristics, each of which includes the transmittance adjusting layer with a satisfactory deposition rate and optical properties, and has satisfactory recording/reproducing characteristics and corrosion resistance of the medium.

Here, among the optical information recording media of the Examples 1 to 11, it was the optical information recording medium produced in the Example 3 that was the best in terms of balance of all the deposition rate, the variation rate of the sputtering rate, the corrosion resistance, and the medium characteristics.

Hence, optical information recording media were produced so that the transmittance adjusting layers 7 hereof each have a slightly different composition from each other around the composition of the transmittance adjusting layer 7 of the optical information recording medium produced in the Example 3. They were evaluated for the deposition rate, the variation rate of the sputtering rate, the corrosion resistance, and the medium characteristics. Here, the corrosion resistance was evaluated under more severe conditions than those used for the accelerated test mentioned above. That is, the optical information recording media were placed in a thermostatic bath set at a temperature of 85° C. and a relative humidity of 85%, and was subject to a 200-hour accelerated test. Subsequently, they were checked for corrosion and separation. Moreover, more severe criteria were employed for evaluating each of the characteristics than those used in the Examples 1 to 11 and the Comparative Examples 1 to 10.

The deposition rate and the variation rate of the sputtering rate were evaluated using the evaluation methods mentioned above, and were evaluated using severer criteria as follows.

The evaluation criteria were as follows. Regarding the sputtering rate when forming the thin film, ○ indicates 6.0 nm/s or more, Δ indicates at least 5.0 nm/s but less than 6.0 nm/s, and x indicates less than 5.0 nm/s.

Regarding the variation rate of the sputtering rate, ○ indicates less than 4.5%, Δ indicates at least 4.5% but less than 5.0%, and x indicates 5.0% or more.

Regarding the corrosion resistance, ○ indicates that no corrosion was observed, Δ indicates the number of corroded points was less than ten, and x indicates the number of corroded points was ten or more.

Regarding the optical constant of the thin film, ○ indicates that the extinction coefficient k1 was 0.05 or less, Δ indicates it was more than 0.05 but less than 0.08, and x indicates it was 0.08 or more.

Regarding the medium characteristics, ○ indicates that the CNR was 45 dB or more and the erasure rate was 25 dB or more, and they were evaluated as x in other cases.

The optical information recording media (Examples 12 to 15) were produced in the same manner as in the Example 1, except that the ratio of $Bi_2O_3$ and $TiO_x$ was changed around the composition of the transmittance adjusting layer 7 produced in the Example 3, that is, a composition of $Bi_2O_3$:$TiO_x$ (x=1.6 to 1.8)=4:6 (in molar ratio). They were evaluated using the new evaluation criteria mentioned above.

Hereinafter, the method for producing the optical information recording media newly produced as the Examples 12 to 15 and the evaluation results thereof will be described.

Example 12

The optical information recording media were formed in the same manner as in the Example 1, except that a sputtering target made of a mixture of 25 mol % of $Bi_2O_3$ powder and 75 mol % of $TiO_x$ powder (x=1.6 to 1.8) was used as the sputtering target for forming the transmittance adjusting layer 7, and the oxygen concentration during sputtering was 3.0 vol %.

In the Example 12, the sputtering rate was 4.95 nm/s (average of 10 samples). As for the optical constants of the thin film (the transmittance adjusting layer) measured separately, the refractive index n1 was 2.77 and the extinction coefficient k1 was 0.03. The variation rate of the sputtering rate was 4.7% at this time.

When measured with the wavelength dispersive X-ray microanalyzer, the composition of the thin film (the transmittance adjusting layer) was composed of 14.2% of Bi, 21.4% of Ti, and 64.4% of O in atom %. This composition is denoted as $Bi_{0.142}Ti_{0.214}O_{0.644}$ in atomic number ratio, and $(Bi_2O_3)_{0.25}(TiO_2)_{0.75}$ in molar ratio of the oxides ($Bi_2O_3$ and $TiO_2$).

As for the recording performance of the optical information recording medium, the CNR was 47 dB and the erasure rate was 28 dB when Pp=12.1 mW and Pb=5.2 mW.

As for the corrosion resistance under the accelerated test conditions of 85° C., 85% RH, and 200 hours, neither corrosion nor separation was observed.

Example 13

The optical information recording media were produced in the same manner as in the Example 1, except that a sputtering target made of a mixture of 35 mol % of $Bi_2O_3$ powder and 65 mol % of $TiO_x$ powder (x=1.6 to 1.8) was used as the sputtering target for forming the transmittance adjusting layer 7, and the oxygen concentration during sputtering was 2.5 vol %.

In the Example 13, the sputtering rate was 6.70 nm/s (average of ten samples). As for the optical constants of the thin film (the transmittance adjusting layer) measured separately, the refractive index n1 was 2.77 and the extinction coefficient k1 was 0.05. The variation rate of the sputtering rate was 4.2% at this time.

When measured with the wavelength dispersive X-ray microanalyzer, the composition of the thin film (the transmittance adjusting layer) was composed of 19.0% of Bi, 17.5% of Ti, and 63.5% of O in atom %. This composition is denoted as $Bi_{0.19}Ti_{0.175}O_{0.635}$ in atomic number ratio, and $(Bi_2O_3)_{0.35}(TiO_2)_{0.65}$ in molar ratio of the oxides ($Bi_2O_3$ and $TiO_2$).

As for the recording performance of the optical information recording medium, the CNR was 47 dB and the erasure rate was 28 dB when Pp=12.0 mW and Pb=5.2 mW.

As for the corrosion resistance under the accelerated test conditions of 85° C., 85% RH, and 200 hours, neither corrosion nor separation was observed.

Example 14

The optical information recording media were produced in the same manner as in the Example 1, except that a sputtering target made of a mixture of 45 mol % of $Bi_2O_3$ powder and 55 mol % of $TiO_x$ powder (x=1.6 to 1.8) was used as the sputtering target for forming the transmittance adjusting layer 7, and the oxygen concentration during sputtering was 2.5 vol %.

In the Example 4, the sputtering rate was 8.45 nm/s (average of ten samples). As for the optical constants of the thin film (the transmittance adjusting layer) measured separately, the refractive index n1 was 2.77 and the extinction coefficient k1 was 0.05. The variation rate of the sputtering rate was 3.8% at this time.

When measured with the wavelength dispersive X-ray microanalyzer, the composition of the thin film (the transmittance adjusting layer) was composed of 23.0% of Bi, 14.0% of Ti, and 63.0% of O in atom %. This composition is denoted as $Bi_{0.23}Ti_{0.14}O_{0.63}$ in atomic number ratio, and $(Bi_2O_3)_{0.45}(TiO_2)_{0.55}$ in molar ratio of the oxides ($Bi_2O_3$ and $TiO_2$).

As for the recording performance of the optical information recording medium, the CNR was 47 dB and the erasure rate was 28 dB when Pp=12.0 mW and Pb=5.2 mW.

As for the corrosion resistance under the accelerated test conditions of 85° C., 85% RH, and 200 hours, neither corrosion nor separation was observed.

Example 15

The optical information recording media were formed in the same manner as in the Example 1, except that a sputtering target made of a mixture of 55 mol % of $Bi_2O_3$ powder and 45 mol % of $TiO_x$ powder (x=1.6 to 1.8) was used as the sputtering target for forming the transmittance adjusting layer 7, and the oxygen concentration during sputtering was 2.5 vol %.

In the Example 15, the sputtering rate was 10.20 nm/s (average of ten samples). As for the optical constants of the thin film (the transmittance adjusting layer) measured separately, the refractive index n1 was 2.77 and the extinction coefficient k1 was 0.06. The variation rate of the sputtering rate was 3.2% at this time.

When measured with the wavelength dispersive X-ray microanalyzer, the composition of the thin film (the transmittance adjusting layer) was composed of 26.8% of Bi, 11.0% of Ti, and 62.2% of O in atom %. This composition is denoted as $Bi_{0.268}Ti_{0.11}O_{0.622}$ in atomic number ratio, and $(Bi_2O_3)_{0.55}(TiO_2)_{0.45}$ in molar ratio of the oxides ($Bi_2O_3$ and $TiO_2$).

As for the recording performance of the optical information recording medium, the CNR was 47 dB and the erasure rate was 28 dB when Pp=12.1 mW and Pb=5.2 mW.

As for the corrosion resistance under the accelerated test conditions of 85° C., 85% RH, and 200 hours, 100 or more corroded and separated points were observed on the entire surface of the medium.

In addition, the optical information recording medium of the Example 3, and the optical information recording media of the Example 2 and Example 4, which each have a transmittance adjusting layer with a similar composition to that of the transmittance adjusting layer 7 of the optical information recording medium produced in the Example 3, were evaluated for the corrosion resistance once again under the conditions of 85° C., 85% RH, and 200 hours. Hereinafter, the results thereof will be described.

The optical information recording medium of the Example 2 was evaluated once again under the conditions of 85° C., 85% RH, and 200 hours, and as a result, neither corrosion nor separation was observed.

The optical information recording medium of the Example 3 was evaluated under the conditions of 85° C., 85% RH, and 200 hours, and as a result, neither corrosion nor separation was observed.

The optical information recording medium of the Example 4 was evaluated under the conditions of 85° C., 85% RH, and 200 hours, and as a result, 8 corroded and separated points were observed.

Table 2 summarizes the results of Examples 2 to 4 and 12 to 15. Note that the evaluation results of each characteristic of the optical information recording media of the Examples 2 to 4 shown in Table 2 are results of evaluations using the same evaluation criteria as in the Examples 12 to 15.

TABLE 2

| Example | Sputtering target composition (mol %) | | | | | | Discharge electrode | Oxygen concentration (vol %) | Deposition rate (nm/s) | Evaluation on deposition rate | Variation rate of deposition rate (%) | Evaluation on variation rate of deposition rate |
|---|---|---|---|---|---|---|---|---|---|---|---|---|
| | $Bi_2O_3$ | $TiO_2$ | $TiO_{1.6-1.8}$ | TiO | Ti | Bi | | | | | | |
| Example 12 | 25 | 0 | 75 | 0 | 0 | 0 | DCp | 3.0% | 4.95 | X | 4.7 | Δ |
| Example 2 | 30 | 0 | 70 | 0 | 0 | 0 | DCp | 3.0% | 5.80 | Δ | 4.5 | Δ |
| Example 13 | 35 | 0 | 65 | 0 | 0 | 0 | DCp | 2.5% | 6.70 | ○ | 4.2 | ○ |
| Example 3 | 40 | 0 | 60 | 0 | 0 | 0 | DCp | 2.5% | 7.65 | ○ | 4.0 | ○ |
| Example 14 | 45 | 0 | 55 | 0 | 0 | 0 | DCp | 2.5% | 8.45 | ○ | 3.8 | ○ |
| Example 4 | 50 | 0 | 50 | 0 | 0 | 0 | DCp | 2.5% | 9.24 | ○ | 3.5 | ○ |
| Example 15 | 55 | 0 | 45 | 0 | 0 | 0 | DCp | 2.5% | 10.20 | ○ | 3.2 | ○ |

TABLE 2-continued

| Example | Optical constant of thin film (n1-ik1) | Evaluation | Density analysis (atom %) Bi | Ti | O | Others | $(Bi_2O_3)_\alpha(TiO_2)_\beta$ α | β | Corrosion resistance of medium (200 h) | Characteristics of medium | Comprehensive evaluation |
|---|---|---|---|---|---|---|---|---|---|---|---|
| Example 12 | 2.77-i0.03 | ○ | 14.2% | 21.4% | 64.4% | 0.0% | 0.25 | 0.75 | ○ | ○ | X |
| Example 2 | 2.77-i0.03 | ○ | 16.6% | 19.4% | 64.0% | 0.0% | 0.30 | 0.70 | ○ | ○ | Δ |
| Example 13 | 2.77-i0.05 | ○ | 19.0% | 17.5% | 63.5% | 0.0% | 0.35 | 0.65 | ○ | ○ | ○ |
| Example 3 | 2.77-i0.05 | ○ | 21.0% | 16.0% | 63.0% | 0.0% | 0.40 | 0.60 | ○ | ○ | ○ |
| Example 14 | 2.77-i0.05 | ○ | 23.0% | 14.0% | 63.0% | 0.0% | 0.45 | 0.55 | ○ | ○ | ○ |
| Example 4 | 2.77-i0.06 | Δ | 25.3% | 12.2% | 62.5% | 0.0% | 0.50 | 0.50 | Δ | ○ | Δ |
| Example 15 | 2.77-i0.06 | Δ | 26.8% | 11.0% | 62.2% | 0.0% | 0.55 | 0.45 | X | ○ | X |

The comprehensive evaluation in Table 2 was made as follows. x indicates that at least one item was evaluated as x among the deposition rate, the deposition rate variation, the optical constant, the corrosion resistance of the medium, and the characteristics of the medium. Δ indicates that at least one item thereof was evaluated as Δ, and ○ indicates that all of these items were evaluated as ○.

As shown in Table 2, the comprehensive evaluation was ○ for the optical information recording medium (the Example 3) using the transmittance adjusting layer 7 with a composition of $Bi_2O_3$:$TiO_x$ (x=1.6 to 1.8)=4:6 (in molar ratio), and the optical information recording media of the Examples 13 and 14. It was Δ for the media of the Examples 2 and 4, and x for the media of the Examples 12 and 15. The evaluation results shown in Table 2 are results obtained under more severe conditions than those commonly used. For this reason, the media of the Examples 12 and 15 were evaluated as x and the media of the Examples 2 and 4 were evaluated as Δ in Table 2. However, when evaluated under the common evaluation conditions, the media of these examples have characteristics satisfactory enough to be evaluated as ○ at the comprehensive evaluation.

The results shown in Table 2 reveal that the optical information recording medium using the transmittance adjusting layer 7 whose composition is denoted as $Bi_xTi_yO_z$, in atomic number ratio, where x, y, and z satisfy $0.165 \leq x \leq 0.255$, $0.120 \leq y \leq 0.195$, $0.625 \leq z \leq 0.640$, and x+y+z=1, and the optical information recording medium using the transmittance adjusting layer 7 whose composition is denoted as $(Bi_2O_3)_\alpha(TiO_2)_\beta$, in molar ratio, where α and β satisfy $0.30 \leq \alpha \leq 0.50$, $0.50 \leq \beta \leq 0.70$, and α+β=1, both exhibit excellent performances particularly with respect to mass productivity, medium characteristics, and corrosion resistance.

In the present example, the dual-layer medium having the first information layer and the second information layer is described as an example. Needless to say, however, the configuration of the present invention can be applied to an optical information recording medium having three or more information layers.

INDUSTRIAL APPLICABILITY

The present invention can provide stably and efficiently an optical information recording medium having excellent recording/reproducing characteristics and corrosion resistance even when it is a multilayer optical information recording medium including a plurality of information layers.

The invention claimed is:

1. An optical information recording medium comprising at least a recording layer that allows information to be recorded thereon and/or reproduced therefrom by being irradiated with a laser beam, a metallic reflective layer, and a transmittance adjusting layer in this order from a laser beam incident side,
   wherein the transmittance adjusting layer contains Bi, Ti, O, and M,
   wherein M is at least one element selected from C, Si, Zr, Hf, Y, Cr, Zn, Ga, Co, In, Ta, Ag, Cu, Pd, Ge, Sb, and Te, and
   with a composition of Bi, Ti, O, and M contained in the transmittance adjusting layer being denoted as $Bi_aTi_bO_cM_d$, in atomic number ratio, a, b, c, and d satisfying $0.252 \leq a \leq 0.35$, $0.07 \leq b \leq 0.125$, $0.61 \leq c \leq 0.65$, $0 < d \leq 0.05$, and a+b+c+d=1, wherein the metallic reflective layer and the transmittance adjusting layer are in contact.

2. The optical information recording medium according to claim 1, comprising N information layers, where N is an integer satisfying $N \geq 2$,
   wherein with the N information layers being referred to as a first information layer to an N-th information layer sequentially from the laser beam incident side, an L-th information layer included in the N information layers includes the recording layer and the transmittance adjusting layer in this order from the laser beam incident side, where L is at least an integer satisfying $1 \leq L \leq N-1$.

3. The optical information recording medium according to claim 1, wherein the atomic number ratio, a and b satisfies $0.252 \leq a \leq 0.29$, and $0.09 \leq b \leq 0.125$.

4. The optical information recording medium according to claim 3, wherein the atomic number ratio, a, b, and c satisfies $0.252 \leq a \leq 0.255$, $0.120 \leq b \leq 0.125$, and $0.625 \leq c \leq 0.640$.

5. The optical information recording medium according to claim 1, wherein the atomic number ratio, a, b, and c satisfies $0.252 \leq a \leq 0.29$, $0.09 \leq b \leq 0.125$, and $0.61 \leq c \leq 0.64$.

6. The optical information recording medium according to claim 1, wherein the transmittance adjusting layer has a thickness of at least 3 nm but not more than 40 nm, or at least 60 nm but not more than 130 nm.

7. A method for manufacturing the optical information recording medium according to claim 1, the method comprising the step of forming the transmittance adjusting layer,
   wherein the step of forming the transmittance adjusting layer is performed by sputtering and uses a sputtering target containing Bi, Ti, M, and O.

8. The method for manufacturing the optical information recording medium according to claim 7, wherein with a composition of Bi, Ti, and O contained in the sputtering target being denoted as $Bi_pTi_qO_r$, in atomic number ratio, p, q, and r satisfy $0.252 \leq p \leq 0.35$, $0.07 \leq q \leq 0.125$, $0.56 \leq r \leq 0.70$, and p+q+r=1.

9. The method for manufacturing the optical information recording medium according to claim 7, wherein the transmittance adjusting layer is formed by direct-current pulse discharge in the step of forming the transmittance adjusting layer.

10. An optical information recording medium comprising at least a recording layer that allows information to be recorded thereon and/or reproduced therefrom by being irradiated with a laser beam, a metallic reflective layer, and a transmittance adjusting layer in this order from a laser beam incident side,
wherein the transmittance adjusting layer contains $Bi_2O_3$, $TiO_2$, and M,
wherein M is at least one element selected from C, Si, Zr, Hf, Y, Cr, Zn, Ga, Co, In, Ta, Ag, Cu, Pd, Ge, Sb, and Te, with a composition of $Bi_2O_3$ and $TiO_2$ contained in the transmittance adjusting layer being denoted as $(Bi_2O_3)_\alpha(TiO_2)_\beta$, in molar ratio, $\alpha$ and $\beta$ satisfying $0.50 \leq \alpha \leq 0.7$, $0.3 \leq \beta 0.50$, and $\alpha+\beta=1$,
wherein, with Bi, Ti, O, and M being denoted as $Bi_a L_b O_c M_d$, in atomic number ratio, a, b, c, and d satisfy $a+b+c+d=1$, wherein the metallic reflective layer and the transmittance adjusting layer are in contact.

11. The optical information recording medium according to claim 10, comprising N information layers, where N is an integer satisfying $N \geq 2$,
wherein with the N information layers being referred to as a first information layer to an N-th information layer sequentially from the laser beam incident side, an L-th information layer included in the N information layers includes the recording layer and the transmittance adjusting layer in this order from the laser beam incident side, where L is at least an integer satisfying $1 \leq L \leq N-1$.

12. The optical information recording medium according to claim 10, wherein the molar ratio, $\alpha$ and $\beta$ satisfies $0.50 \leq \alpha \leq 0.65$, and $0.35 \leq \beta \leq 0.50$.

13. The optical information recording medium according to claim 10, wherein the atomic number ratio a, b, c, and d further satisfies $0.252 \leq a \leq 0.35$, $0.07 \leq b \leq 0.125$, $0.61 \leq c \leq 0.65$, and $0 < d \leq 0.05$.

* * * * *